(12) United States Patent
Chen et al.

(10) Patent No.: US 12,506,058 B2
(45) Date of Patent: Dec. 23, 2025

(54) MULTI-LINER TSV STRUCTURE AND METHOD FORMING SAME

(71) Applicant: Taiwan Semiconductor Manufacturing Co., Ltd., Hsinchu (TW)

(72) Inventors: Ming-Fa Chen, Taichung (TW); Chin-Shyh Wang, Hsinchu (TW); Chao-Wen Shih, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/358,570

(22) Filed: Jul. 25, 2023

(65) Prior Publication Data

US 2024/0021509 A1 Jan. 18, 2024

Related U.S. Application Data

(63) Continuation of application No. 17/135,435, filed on Dec. 28, 2020, now Pat. No. 11,823,989.

(Continued)

(51) Int. Cl.
*H01L 21/02* (2006.01)
*H01L 21/762* (2006.01)
(Continued)

(52) U.S. Cl.
CPC .. *H01L 23/49827* (2013.01); *H01L 21/76224* (2013.01); *H01L 21/7684* (2013.01);
(Continued)

(58) Field of Classification Search
CPC ............. H01L 21/486; H01L 21/76877; H01L 21/76883; H01L 21/76898; H01L 23/481;
(Continued)

(56) References Cited

U.S. PATENT DOCUMENTS

| | | | |
|---|---|---|---|
| 8,754,531 B2 * | 6/2014 | Chiu ................. | H01L 21/76898 438/653 |
| 9,142,490 B2 | 9/2015 | Park et al. | |

(Continued)

FOREIGN PATENT DOCUMENTS

| | | |
|---|---|---|
| KR | 20150012573 A | 2/2015 |
| KR | 20170030478 A | 3/2017 |

*Primary Examiner* — Kretelia Graham
*Assistant Examiner* — William Henry Anderson
(74) *Attorney, Agent, or Firm* — Slater Matsil, LLP

(57) ABSTRACT

A method includes etching a substrate to form an opening, depositing a first dielectric liner extending into the opening, and depositing a second dielectric liner over the first dielectric liner. The second dielectric liner extends into the opening. A conductive material is filled into the opening. The method further includes performing a first planarization process to planarize the conductive material so that a portion of the conductive material in the opening forms a through-via, performing a backside grinding process on the substrate until the through-via is revealed from a backside of the substrate, and forming a conductive feature on the backside of the substrate. The conductive feature is electrically connected to the through-via.

20 Claims, 25 Drawing Sheets

Related U.S. Application Data

(60) Provisional application No. 63/053,332, filed on Jul. 17, 2020.

(51) Int. Cl.
*H01L 21/768* (2006.01)
*H01L 23/48* (2006.01)
*H01L 23/498* (2006.01)

(52) U.S. Cl.
CPC .. *H01L 21/76846* (2013.01); *H01L 21/76898* (2013.01); *H01L 23/481* (2013.01); *H01L 21/02164* (2013.01); *H01L 21/02167* (2013.01); *H01L 21/0217* (2013.01); *H01L 21/02274* (2013.01); *H01L 21/76831* (2013.01); *H01L 21/76832* (2013.01); *H01L 2221/1057* (2013.01); *H01L 2221/1068* (2013.01)

(58) Field of Classification Search
CPC ........... H01L 23/49827; H01L 23/5226; H01L 21/76831; H01L 25/043; H01L 25/072; H01L 2225/06544; H01L 2924/0002; H01L 2225/06541; H01L 23/5385; H01L 23/5383; H01L 23/5386; H01L 2924/00; H01L 21/02271; H01L 21/31053; H01L 21/30625; H01L 21/76844; H01L 21/3212; H01L 21/02274; H01L 21/76846; H01L 23/5384; H01L 25/0655; H01L 25/115; H01L 25/0753; H01L 21/76832; H01L 21/76224; H01L 21/7684
See application file for complete search history.

(56) References Cited

U.S. PATENT DOCUMENTS

| | | |
|---|---|---|
| 9,412,719 B2 | 8/2016 | Tsai et al. |
| 9,748,180 B2 | 8/2017 | Puri et al. |
| 10,505,111 B1 | 12/2019 | Ok et al. |
| 2010/0090318 A1 | 4/2010 | Hsu et al. |
| 2010/0213612 A1* | 8/2010 | Tseng ............... H01L 21/76898 |
| | | 257/E23.161 |
| 2011/0169168 A1 | 7/2011 | Tseng et al. |
| 2012/0043666 A1* | 2/2012 | Park ................... H01L 25/0657 |
| | | 257/774 |
| 2012/0064713 A1 | 3/2012 | Russell et al. |
| 2012/0091593 A1 | 4/2012 | Cheng et al. |
| 2012/0142190 A1 | 6/2012 | Tsao et al. |
| 2013/0082385 A1* | 4/2013 | Kirkpatrick ......... H01L 23/5329 |
| | | 438/643 |
| 2014/0004698 A1* | 1/2014 | Huang .................. H01L 21/743 |
| | | 438/653 |
| 2014/0231986 A1* | 8/2014 | Dubin .................. H01L 21/486 |
| | | 257/737 |
| 2014/0264911 A1 | 9/2014 | Lin et al. |
| 2014/0327150 A1* | 11/2014 | Jung .................... H01L 21/561 |
| | | 257/774 |
| 2015/0028494 A1* | 1/2015 | Park .................. H01L 21/76831 |
| | | 257/774 |
| 2015/0069608 A1 | 3/2015 | Collins et al. |
| 2015/0115445 A1* | 4/2015 | Jindal ............... H01L 21/76898 |
| | | 257/774 |
| 2016/0111351 A1* | 4/2016 | Ma .................... H01L 21/76898 |
| | | 438/653 |
| 2016/0111372 A1* | 4/2016 | Lu ..................... H01L 21/31111 |
| | | 438/666 |
| 2017/0148674 A1 | 5/2017 | Lu et al. |
| 2018/0350667 A1 | 12/2018 | Chang et al. |
| 2019/0067107 A1* | 2/2019 | Yu ......................... H01L 23/481 |
| 2020/0020610 A1* | 1/2020 | Lim .................. H01L 21/76898 |
| 2020/0185330 A1 | 6/2020 | Yu et al. |

\* cited by examiner

MULTI-LINER TSV STRUCTURE AND METHOD FORMING SAME

PRIORITY CLAIM AND CROSS-REFERENCE

This application is a continuation of U.S. patent application Ser. No. 17/135,435, filed on Dec. 28, 2020, and entitled "Multi-Liner TSV Structure and Method Forming Same," which claims the benefit of U.S. Provisional Application No. 63/053,332, filed on Jul. 17, 2020, and entitled "TSV Multi-layer Liner Structure," which applications are hereby incorporated herein by reference.

BACKGROUND

Through-Silicon Vias (TSVs) are used as electrical paths in device dies, so that the conductive features on opposite sides of the device dies may be interconnected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
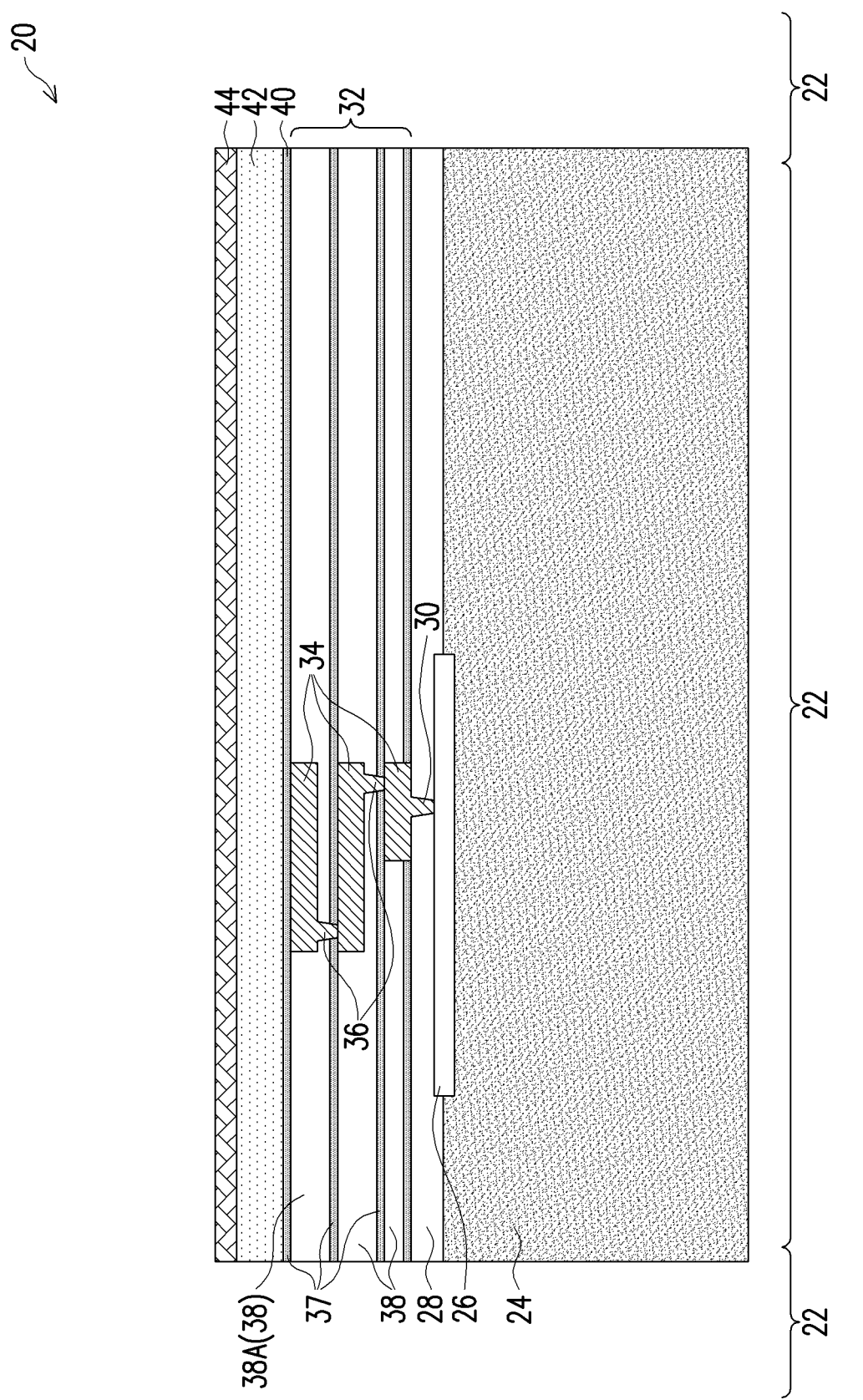
FIGS. 1 through 16 illustrate the cross-sectional views of intermediate stages in the formation of a device die including through-vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die including multi-liner through-vias and the method of forming the same are provided in accordance with some embodiments. The die includes a plurality of dielectric liners, which are formed of different materials. For example, an outer liner may be formed of silicon nitride, silicon carbide, or silicon oxynitride, and an inner liner may be formed of silicon oxide. The multiple liners may serve different functions. For example, an outer liner may have good moisture-resistance for preventing moisture from reaching low-k dielectric layers and metal lines. An inner liner may have a low leakage. The intermediate stages in the formation of the device die are illustrated in accordance with some embodiments. Some variations of some embodiments are discussed. Throughout the various views and illustrative embodiments, like reference numbers are used to designate like elements.

Figure 25:
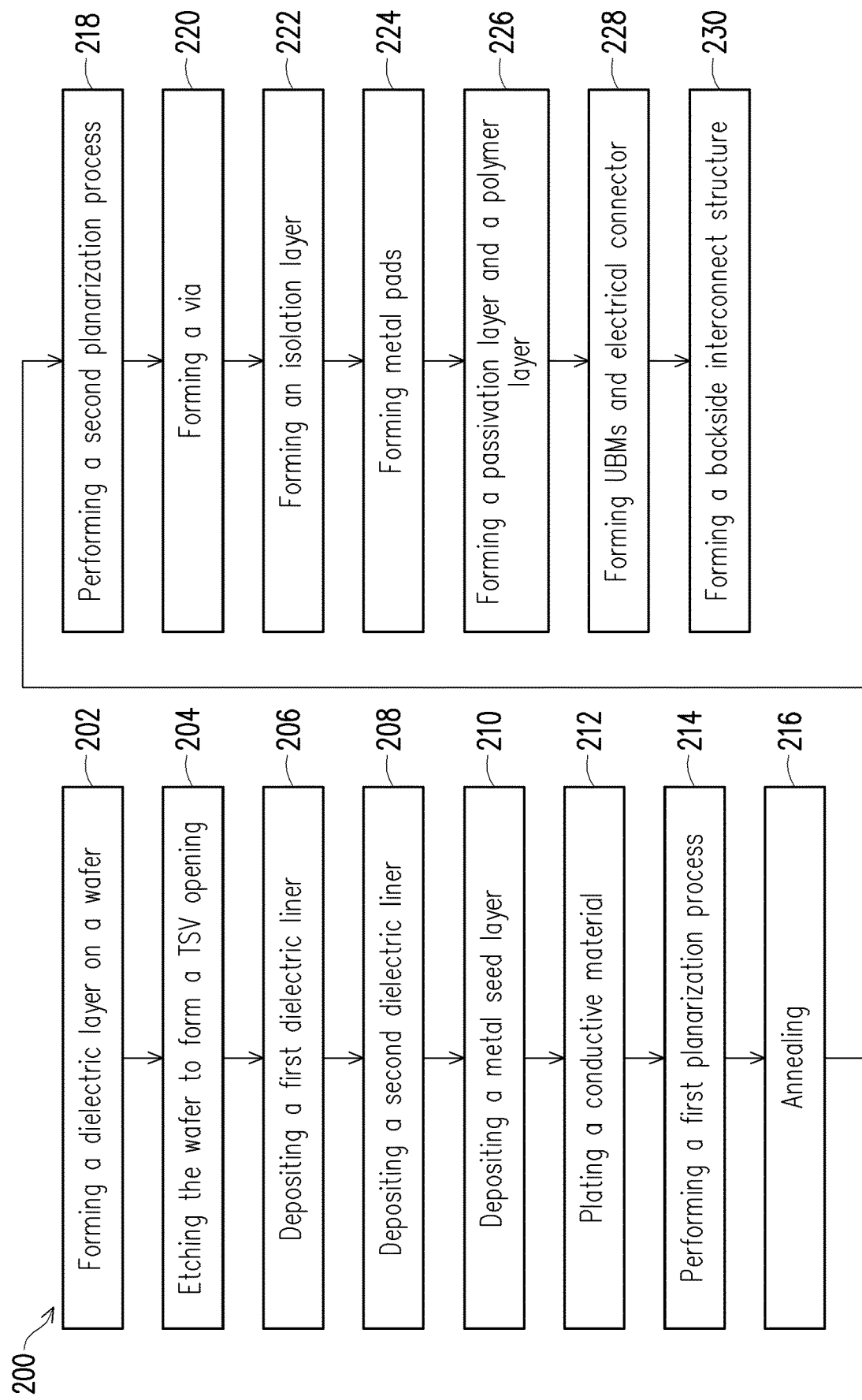
FIG. 25 illustrates a process flow for forming a device die including a multi-liner through-via in accordance with some embodiments.

FIGS. 1 through 16 illustrate the cross-sectional views of intermediate stages in the formation of a device die including through-vias in accordance with some embodiments of the present disclosure. The corresponding processes are also reflected schematically in the process flow 200 as shown in FIG. 25.

FIG. 1 illustrates a cross-sectional view of wafer 20. In accordance with some embodiments of the present disclosure, wafer 20 is or comprises a device wafer including active devices and possibly passive devices, which are represented as integrated circuit devices 26. Wafer 20 may include a plurality of chips/dies 22 therein, with one of chips 22 being illustrated. In accordance with alternative embodiments of the present disclosure, wafer 20 is an interposer wafer, which is free from active devices, and may or may not include passive devices.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Shallow Trench Isolation (STI) regions (not shown) may be formed in semiconductor substrate 24 to isolate the active regions in semiconductor substrate 24.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of silicon oxide, Phospho Silicate Glass (PSG), Boro Silicate Glass (BSG), Boron-doped Phospho Silicate Glass (BPSG), Fluorine-doped Silicate Glass (FSG), or the like. ILD 28 may be formed using spin coating, Flowable Chemical Vapor Deposition (FCVD), or the like. In accordance with some embodiments of the present disclosure, ILD 28 may also be formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)) and etch stop layers 37. The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38, and then performing a curing process to drive out the porogen, and hence the remaining dielectric layers 38 are porous. Etch stop layers 37 may be formed of or comprises silicon nitride, silicon carbide, silicon oxycarbide, silicon oxynitride, or the like.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. The metal lines 34 in top dielectric layer 38A may also be formed of copper or a copper alloy, and may have a dual damascene structure or a single damascene structure.

In accordance with some embodiments, etch stop layer 40 is deposited on the top dielectric layer 38A and the top metal layer. Etch stop layer 40 may be formed of or comprises silicon nitride, silicon carbide, silicon oxycarbide, silicon oxynitride, or the like.

Passivation layer 42 (sometimes referred to as passivation-1 or pass-1) is formed over etch stop layer 40. In accordance with some embodiments, passivation layer 42 is formed of a non-low-k dielectric material having a dielectric constant greater than the dielectric constant of silicon oxide. Passivation layer 42 may be formed of or comprise an inorganic dielectric material, which may include a material selected from, and is not limited to, Undoped Silicate Glass (USG), silicon nitride (SiN), silicon oxide ($SiO_2$), silicon oxy-nitride (SiON), silicon oxycarbide (SiOC), silicon carbide (SiC), or the like, combinations thereof, and multi-layers thereof. In accordance with some embodiments, the top surfaces of top dielectric layer 38A and metal lines 34 therein are coplanar. Accordingly, passivation layer 42 may be a planar layer.

In accordance with some embodiments, dielectric layer 44 is deposited over passivation layer 42. The respective process is illustrated as process 202 in the process flow 200 as shown in FIG. 25. Dielectric layer 44 is formed of or comprises a material different from that of passivation layer 42, and may be formed of or comprise SiC, SiN, SiON, SiOC, or the like.

Figure 2:
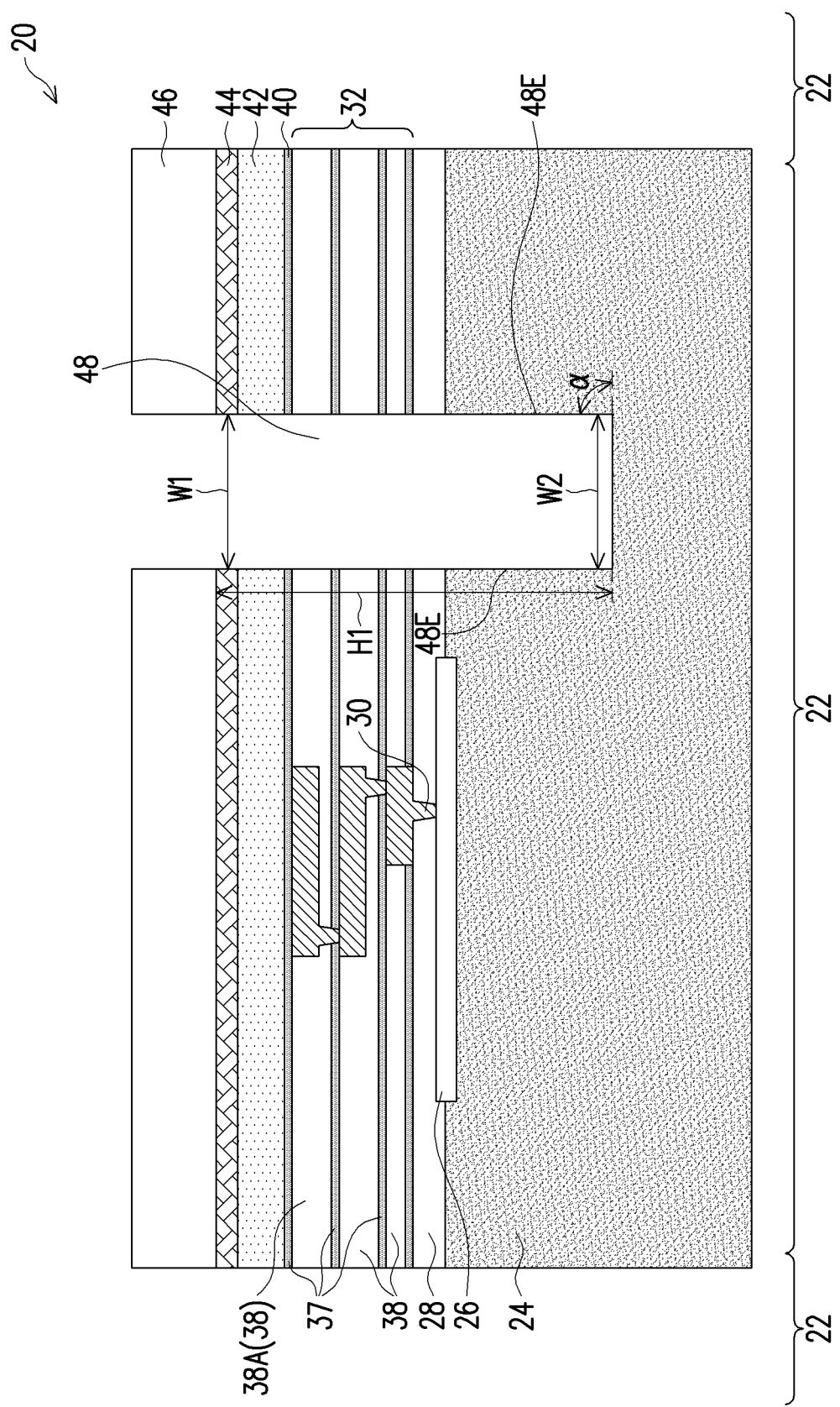

Referring to FIG. 2, etching mask 46 is formed and then patterned. In accordance with some embodiments, etching mask 46 comprises photo resist, and may or may not include a hard mask formed of TiN, BN, or the like. An anisotropic etching process is then performed to form an opening penetrating through dielectric layers including dielectric layer 44, passivation layer 42, etch stop layer 40, IMDs 38, etch stop layers 37, ILD 28, etc. Semiconductor substrate 24 is further etched so that opening 48 extends to an intermediate level of substrate 24, wherein the intermediate level is between the top surface and the bottom surface of semiconductor substrate 24. Opening 48 is thus formed. The respective process is illustrated as process 204 in the process flow 200 as shown in FIG. 25. Opening 48 is used for forming a Through-Semiconductor Via (TSV, also sometimes referred to as a Through-Silicon Via), and hence is referred to as TSV opening 48 hereinafter. The anisotropic etching process includes a plurality of etching processes, which adopt different etching gases in order to etch the dielectric layers that are formed of different materials, and to etch semiconductor substrate 24.

In accordance with some embodiments, TSV opening 48 has top width W1 and bottom width W2 smaller than top width W1. TSV opening 48 may have slanted-and-straight edges 48E, wherein tilt angle α of the straight edges 48E are smaller than 90 degrees, for example, in the range between about 80 degrees and about 90 degrees. The aspect ratio H1/W1 of opening 48 may be in the range between about 2 and about 10 in accordance with some embodiments. Etching mask 46 is removed after the formation of TSV opening 48, for example, through an ashing process.

Figure 3:
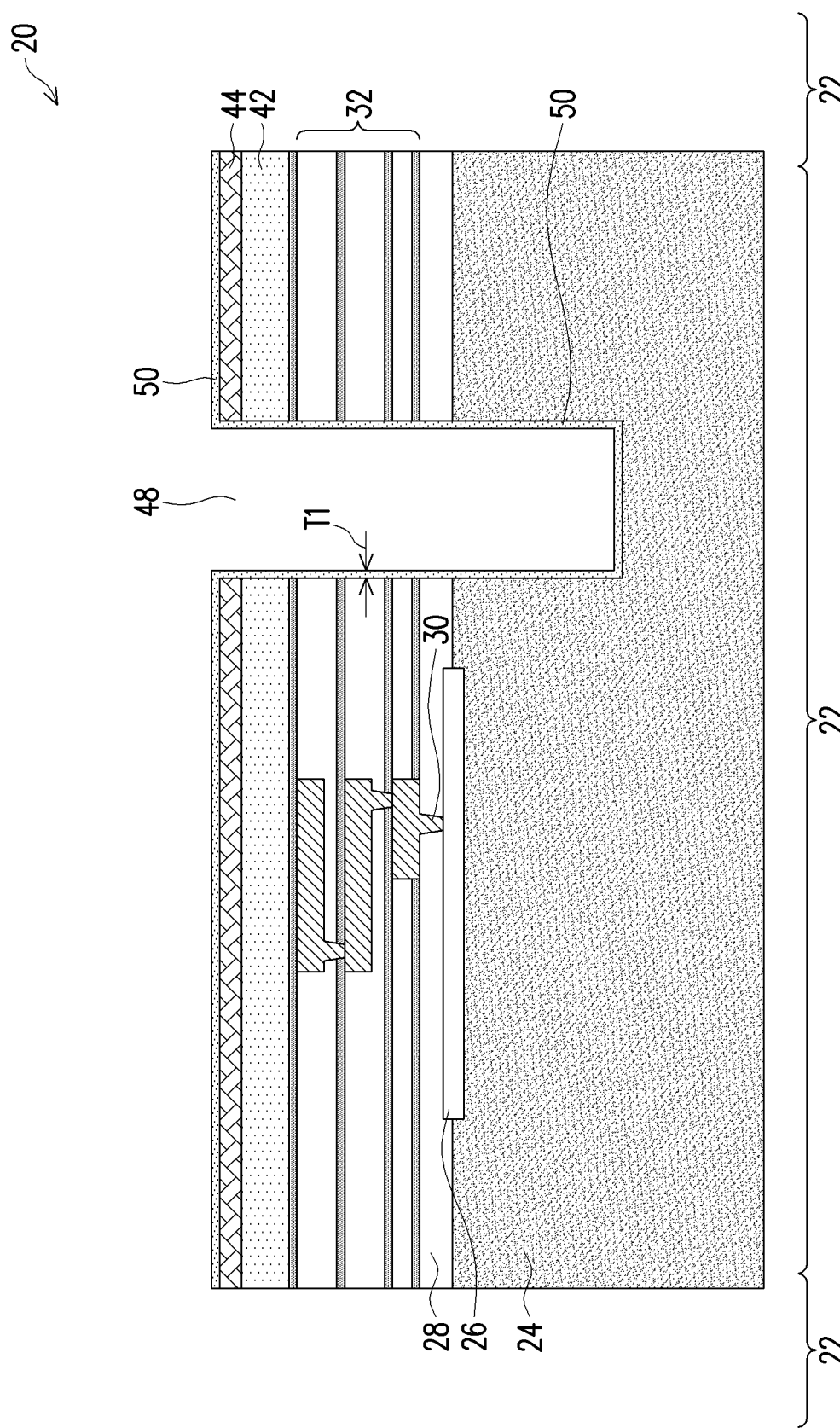

Referring to FIG. 3, a first dielectric liner 50 is deposited. The respective process is illustrated as process 206 in the process flow 200 as shown in FIG. 25. Dielectric liner 50 is deposited as a conformal layer or a substantially conformal layer, so that the horizontal portions and vertical portions of dielectric liner 50 have thicknesses close to each other, for example, with a variation smaller than about 20 percent or 10 percent. The deposition method may include Atomic Layer Deposition (ALD), Plasma Enhance Chemical Vapor Deposition (PECVD), or the like. The precursors for forming dielectric liner 50 may include a silicon-containing precursor such as $SiCl_4$, $SiH_2Cl_2$, $Si_2Cl_6$, $Si_3Cl_8$, or the like, and a nitrogen-containing precursor such as $NH_3$, for example, when SiN is to be formed. In accordance with some embodiments, dielectric liner 50 has a good moisture-resistant ability, so that it is difficult for moisture to penetrate through dielectric liner 50, for example, through opening 48, and reaches low-k dielectric layers 38. Since low-k dielectric layers 38 are porous and can absorb moisture easily, the moisture may reach metal lines 34 and vias 36 to cause copper nodule defect. Therefore, once the moisture-resistant dielectric liner 50 is deposited, it may effectively prevent the moisture from reaching low-k dielectric layers 38, metal lines 34, and vias 36, even if opening 48 is exposed to an external environment. In accordance with some embodiments, dielectric liner 50 is formed of or comprises silicon nitride, silicon carbide, silicon oxycarbide, or the like, or combinations thereof. The thickness T1 of dielectric liner 50 may be in the range between about 50 Å and about 1,500 Å.

Figure 4:
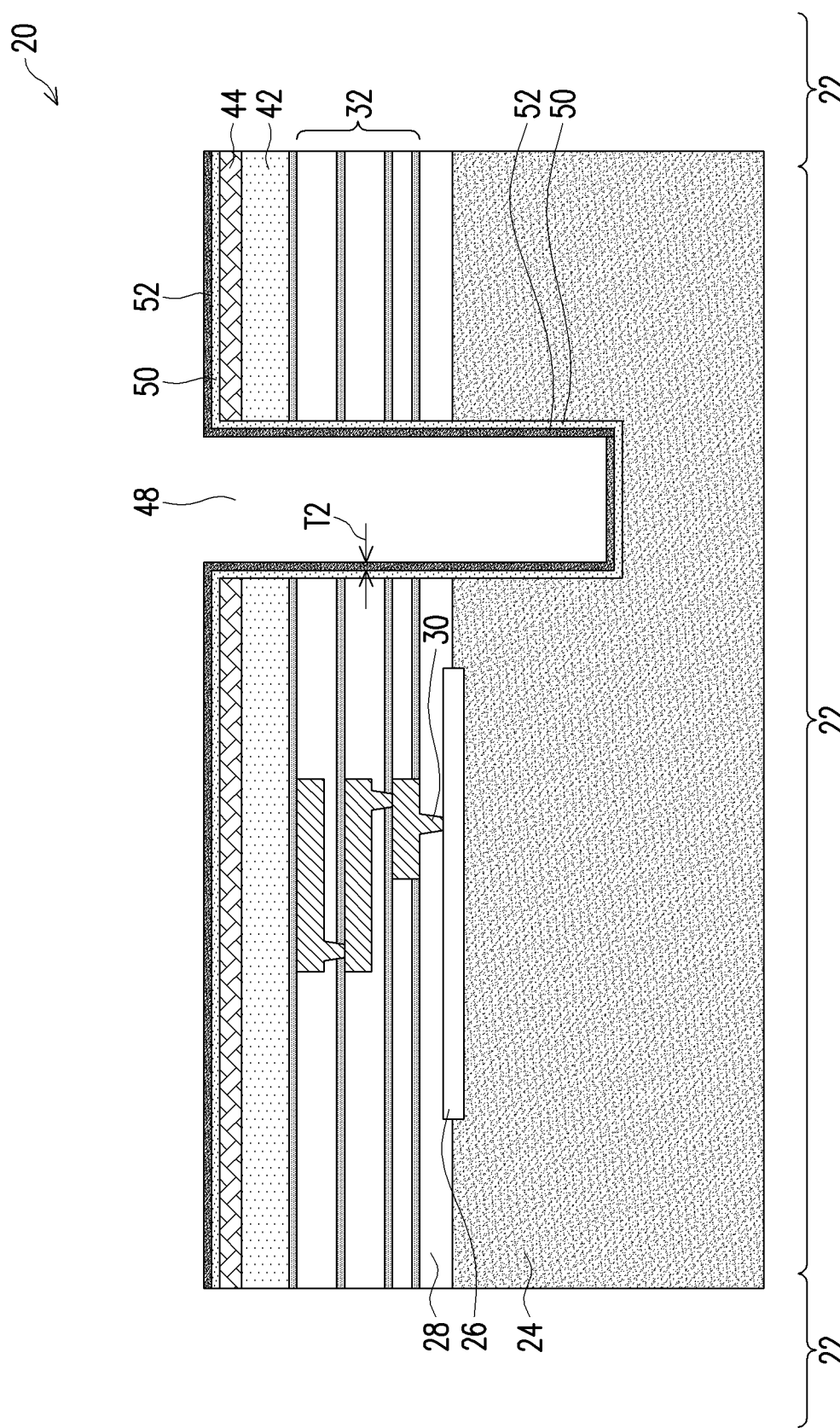

Referring to FIG. 4, a second dielectric liner 52 is deposited on the first dielectric liner 50. The respective process is illustrated as process 208 in the process flow 200 as shown in FIG. 25. Dielectric liner 52 is also deposited as a conformal layer, so that the horizontal portions and vertical portions of dielectric liner 52 have thicknesses close to each other, for example, with a variation smaller than about 20 percent or 10 percent. The deposition method may include Atomic Layer Deposition (ALD), Chemical Vapor Deposition (CVD), or the like. In accordance with some embodiments, dielectric liner 52 is formed of a material different from the material of dielectric liner 50. For example, dielectric liner 52 may be formed of a material that has lower leakage (of current) than dielectric liner 50. On the other hand, since dielectric liner 50 already has the moisture-resistance ability, the moisture-resistance ability of dielectric liner 52 may be lower than that of dielectric liner 50. In accordance with some embodiments, dielectric liner 52 is formed of or comprises silicon oxide, silicon oxynitride, or the like. The thickness T2 of dielectric liner 52 may be in the range between about 500 Å and about 2,500 Å. Dielectric liners 50 and 52 are also collectively referred to as a multi-layer dielectric liner.

Figure 5:
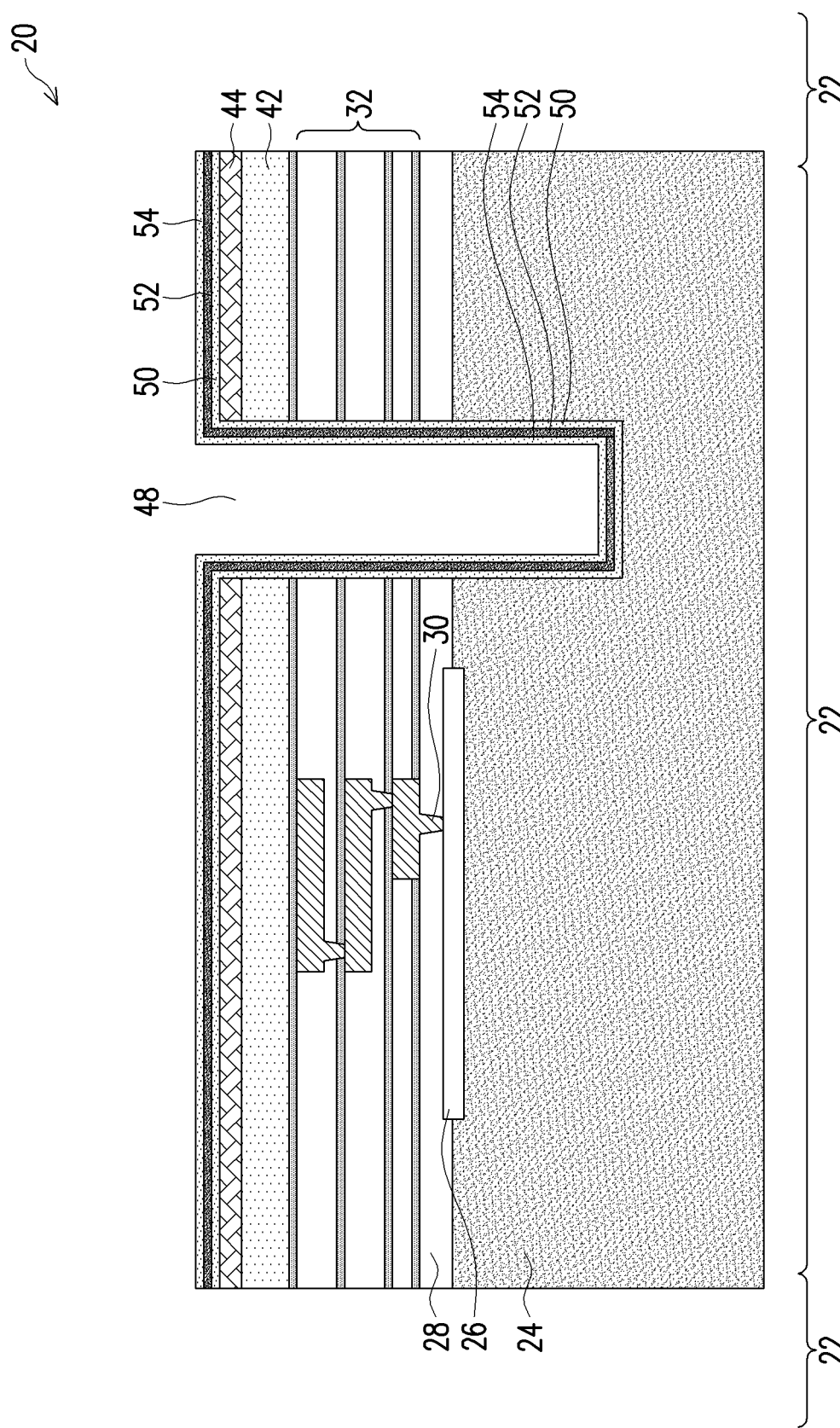

In accordance with some embodiments, dielectric liner 52 is formed using precursors comprising $N_2$, $O_2$, $N_2O$, Bis (tertiary-butylamino silane) (BTBAS), and/or combinations thereof. The resulting dielectric liner 52 may thus comprise silicon oxide or silicon oxynitride. In accordance with some embodiments, both of dielectric liner 52 and dielectric liner 50 comprise silicon, and dielectric liner 50 has a higher nitrogen atomic percentage than dielectric liner 52, and dielectric liner 52 has a higher oxygen atomic percentage than dielectric liner 50. For example, both of dielectric liner 52 and dielectric liner 50 may comprise silicon oxynitride, except dielectric liner 52 has a higher oxygen atomic percentage (at the time of deposition) than dielectric liner 50, and dielectric liner 50 has a higher nitrogen atomic percentage (at the time of deposition) than dielectric liner layer 52. This may be achieved conducting both of an oxygen-containing process gas and a nitrogen-containing process gas, and adopting different flow rates of the process gases for depositing dielectric liners 50 and 52. In accordance with Alternative embodiments, the formation of dielectric liner 50 and dielectric liner 52 may include depositing a silicon nitride layer first as dielectric liner 50, and then gradually transition to the deposition of silicon oxide as dielectric liner 52. In the transition process, the flow rate of oxygen-containing process gas is gradually increased, and the flow rate of the nitrogen-containing process gas is gradually reduced, and until the nitrogen-containing process gas is turned off to further deposit silicon oxide as dielectric liner 50. Deposition methods such as CVD or PECVD may be used in accordance with these embodiments. In accordance with some embodiments, dielectric liner 52 is a single layer formed of a homogeneous material, which is in physical contact with dielectric liner 52 and the subsequently formed seed layer 54 (FIG. 5).

Dielectric liners 50 and 52 may have different densities. In accordance with some embodiments, dielectric liner 50 is denser than dielectric liner 52. For example, dielectric liner 50 may have a density DS50 in the range between about 2.5 $g/cm^3$ and about 4.0 $g/cm^3$. Dielectric liner 52 may have a density DS52 in the range between about 2.0 $g/cm^3$ and about 3.0 $g/cm^3$. The density difference (DS50–DS52) may be greater than about 0.5 $g/cm^3$, and may be in the range between about 0.5 $g/cm^3$ and about 1.0 $g/cm^3$.

If dielectric liner 50 is not formed, dielectric liner 52 would have been formed to be in direct contact with low-k dielectric layers 38. The formation of dielectric liner 52 (such as silicon oxide) may result in byproducts, which may attack low-k dielectric materials in the low-k dielectric layers 38. By forming dielectric liner 50 first, the byproduct generated in the formation of dielectric liner 52, if any, is separated from low-k dielectric layers 38 by dielectric liner 50, and cannot attack low-k dielectric layers 38 anymore.

In accordance with some embodiments, a dual-liner including dielectric liners 50 and 52 is formed. In accordance with alternative embodiments, a multi-layer liner including more than two dielectric liners may be formed. For example, a third dielectric liner may be deposited between dielectric liners 50 and 52. In accordance with some embodiments, the third dielectric liner has a property between the properties of dielectric liners 50 and 52, and hence can be used as a buffer layer between dielectric liners 50 and 52. For example, when dielectric liners 50 and 52 are formed of SiN and $SiO_2$, respectively, the additional dielectric liner between dielectric liners 50 and 52 may be formed of or comprise silicon oxynitride. The additional dielectric liner between dielectric liners 50 and 52 may also be formed of or comprise silicon carbide. The three or more dielectric liners may be deposited in different processes using different precursors.

FIG. 5 illustrates the deposition of metal seed layer 54. The respective process is illustrated as process 210 in the process flow 200 as shown in FIG. 25. In accordance with some embodiments, metal seed layer 54 is formed through Physical Vapor Deposition (PVD). Metal seed layer 54 may be a single layer, for example, formed of copper, or may include a plurality of layers, for example, including a conductive barrier layer and a copper layer on the conductive barrier layer. The conductive barrier layer may be formed of or comprise TiN, Ti, or the like.

Figure 6:
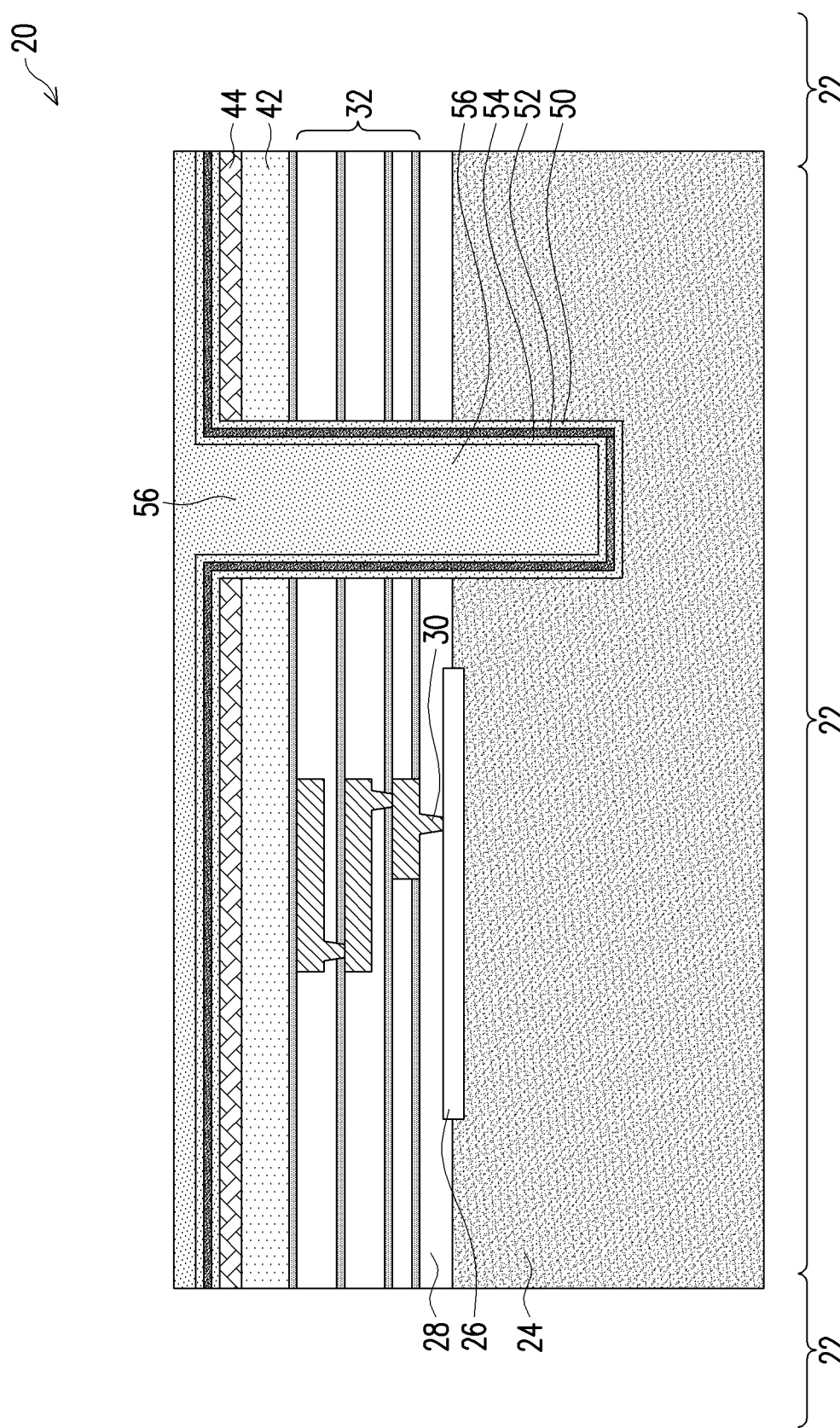

FIG. 6 illustrates the deposition of conductive material 56, which may be a metallic material such as copper or a copper alloy. The respective process is illustrated as process 212 in the process flow 200 as shown in FIG. 25. The deposition process may be performed using electrochemical plating (ECP), electro-less plating, or the like. The plating is performed until the top surface of the plated conductive material 56 is higher than the top surface of dielectric liner 50 or 52.

Figure 7:
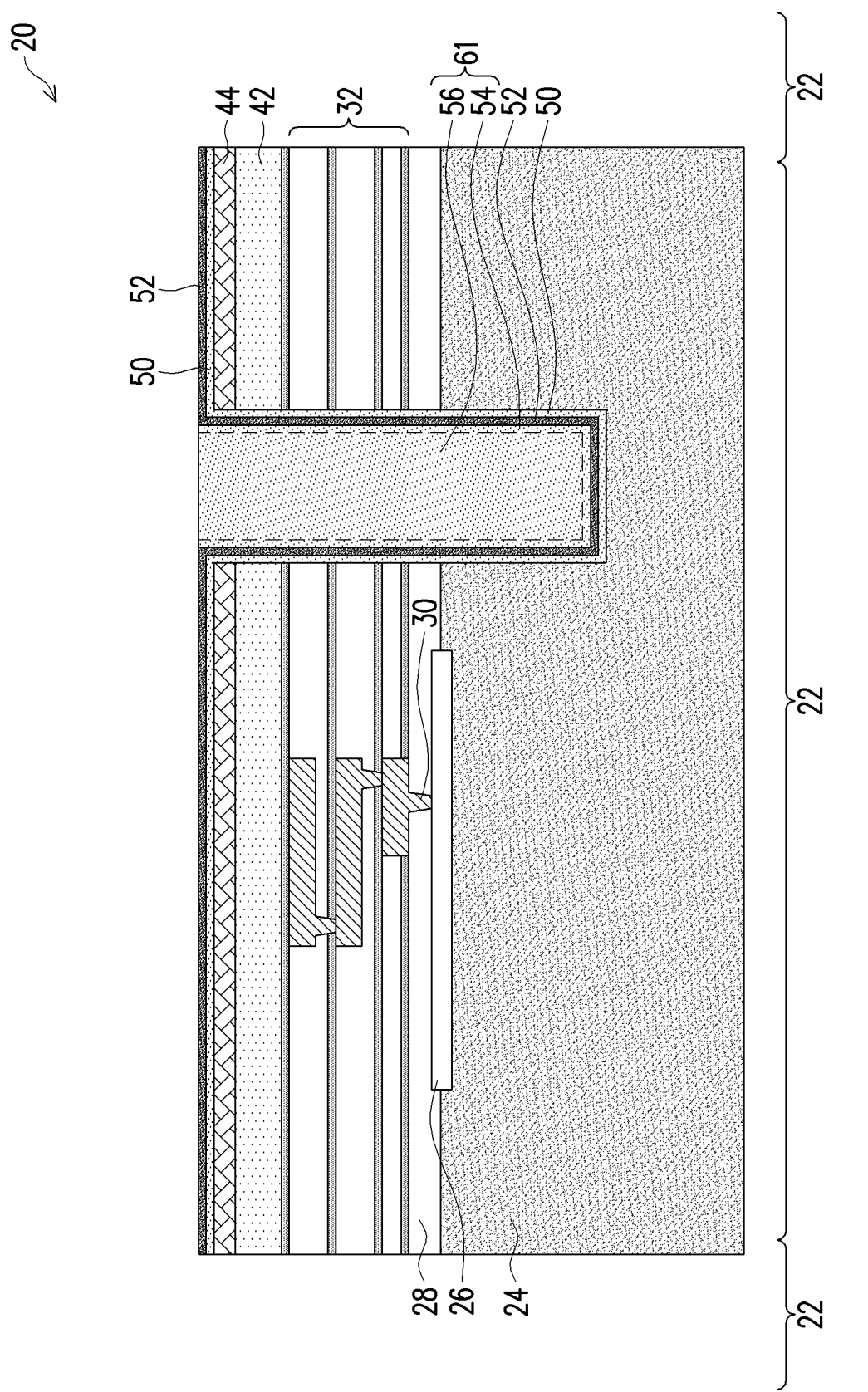

FIG. 7 illustrates a planarization process, which may be a CMP process or a mechanical grinding process, to planarize the top surface of conductive material 56. The respective process is illustrated as process 214 in the process flow 200 as shown in FIG. 25. In accordance with some embodiments, the first CMP process is performed using the horizontal portions of dielectric liner 52 as a CMP stop layer, as illustrated in FIG. 7. In accordance with alternative embodiments, the first CMP process is performed using the horizontal portions of dielectric liner 50 as the CMP stop layer. Accordingly, the top surface of the remaining conductive material 56 will be coplanar with the top surfaces of the horizontal portions of dielectric liner 50. In accordance with yet alternative embodiments, the first CMP process is performed using dielectric layer 44 as the CMP stop layer. Accordingly, the top surface of the remaining conductive material 56 will be coplanar with the top surfaces of dielectric layer 44.

Figure 8:
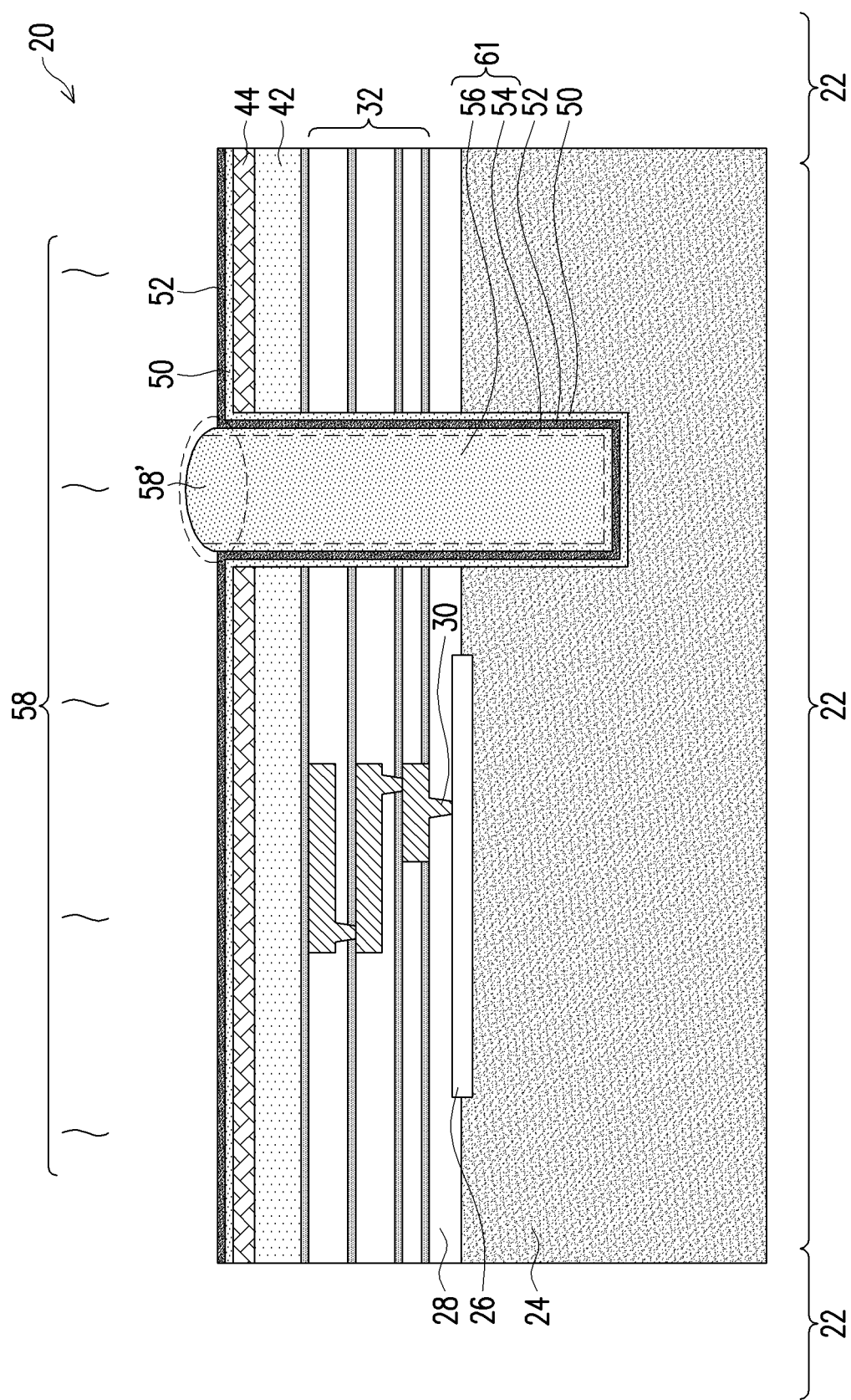

Next, as shown in FIG. 8, an annealing process 58 is performed. The respective process is illustrated as process 216 in the process flow 200 as shown in FIG. 25. In accordance with some embodiments, the annealing process 58 is performed using furnace annealing, rapid thermal annealing, flash annealing, or the like. The annealing temperature may be in the range between about 250° C. and about 450° C. The annealing duration is related to the method used. For example, when furnace annealing is used, the annealing duration may be in the range between about 30 minutes and about 120 minutes.

Figure 9:
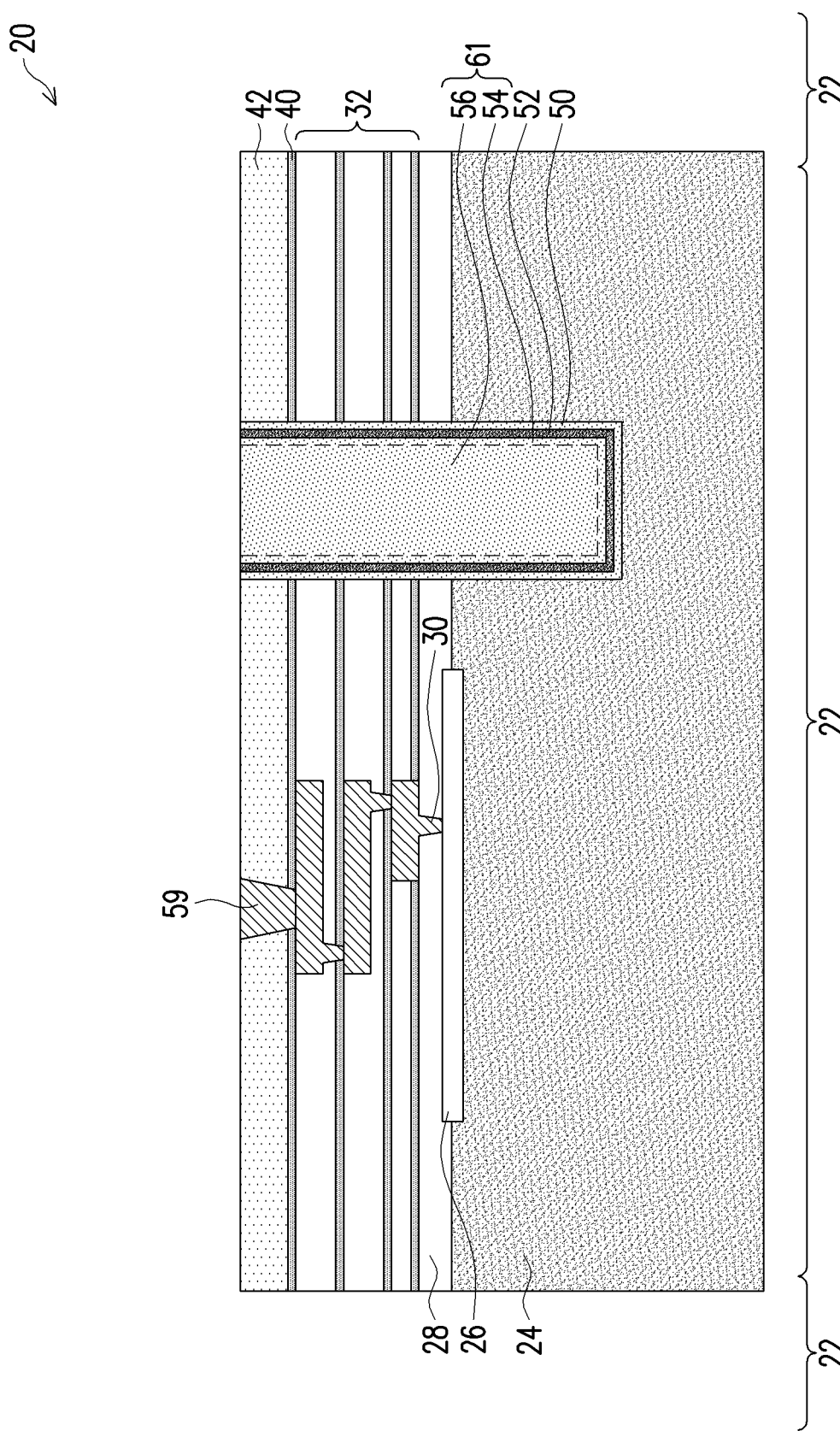

As a result of the annealing process 58, conductive material 56 may have a portion popping up, forming hump 58', as shown in FIG. 8. In subsequent processes, a second planarization process is performed to remove the hump 58', and the resulting structure is shown in FIG. 9. The respective process is illustrated as process 218 in the process flow 200 as shown in FIG. 25. In accordance with some embodiments, the second planarization process further removes the horizontal portions of dielectric liners 50 and 52, and may or may not remove dielectric layer 44, which is used to protect passivation layer 42 in preceding processes. The second planarization process may be a CMP process, and may be performed using passivation layer 42 as a CMP stop layer. Accordingly, after the second CMP process, passivation layer 42 is revealed in accordance with some embodiments. The remaining portions of conductive material 56 and seed layer 54 are collectively referred to as TSV 61. Although one TSV 61 is illustrated, a plurality of TSVs 61 are formed simultaneously.

In accordance with alternative embodiments, instead of performing two planarization processes with an annealing process performed in between, no planarization process is performed before the annealing process, and a single planarization process is performed after the annealing process. Alternatively stated, the planarization process as shown in FIG. 7 is skipped, while the annealing process as shown in FIG. 8 and the CMP process as shown in FIG. 9 are performed.

In the example shown in FIG. 9, the top surface of TSV 61 are level with (and may be higher than) passivation layer 42. In accordance with alternative embodiments, the top surface of TSV 61 may be at any level between (and including) the top surface 24A of semiconductor substrate 24 and the top surface of passivation layer 42. For example, the top surface of TSV 61 may be level with the top surface of any dielectric layer in interconnect structure 32. In accordance with these embodiments, additional dielectric layers will be formed after the formation of TSV 61, and metal lines, vias, redistribution lines, etc. will be formed in the additional dielectric layers to electrically connect TSVs to the overlying electrical connectors (such as electrical connectors 70 (FIG. 16)) as subsequently discussed.

Further referring to FIG. 9, via 59 is formed to connect to top metal line/pad 34. The respective process is illustrated as process 220 in the process flow 200 as shown in FIG. 25. In accordance with some embodiments, via 59 is formed through a single damascene process. The formation process may include etching passivation layer 42 to form an opening, depositing a conductive barrier (formed of titanium, titanium nitride, tantalum, tantalum nitride, or the like, for example), and plating a conductive material such as copper, tungsten, or the like. A CMP process may then be performed to remove excess material, leaving via 59.

Figure 10:
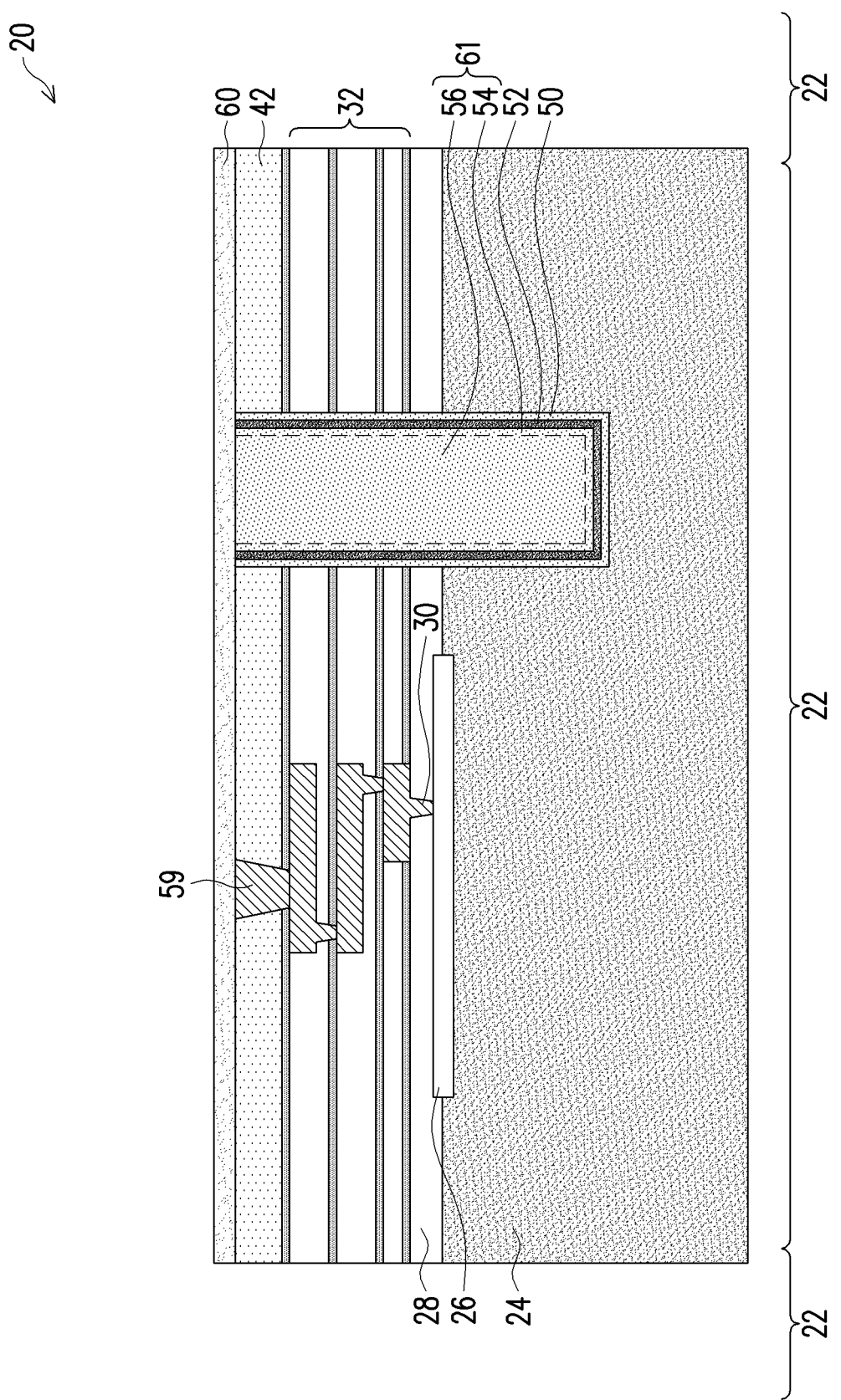

Referring to FIG. 10, in accordance with some embodiments, a dielectric isolation layer 60 is deposited. The respective process is illustrated as process 222 in the process flow 200 as shown in FIG. 25. Isolation layer 60 may be formed of or comprise a moisture-resistant material, so that it may prevent moisture from penetrating through it to reach the underlying layers. The material of isolation layer 60 may be selected from the same group of candidate materials for forming dielectric liner 50, and may be the same as or different from the material of dielectric liner 50. For example, when dielectric liner 50 is formed of silicon nitride, isolation layer 60 may be formed of silicon nitride or silicon carbide.

Figure 11:
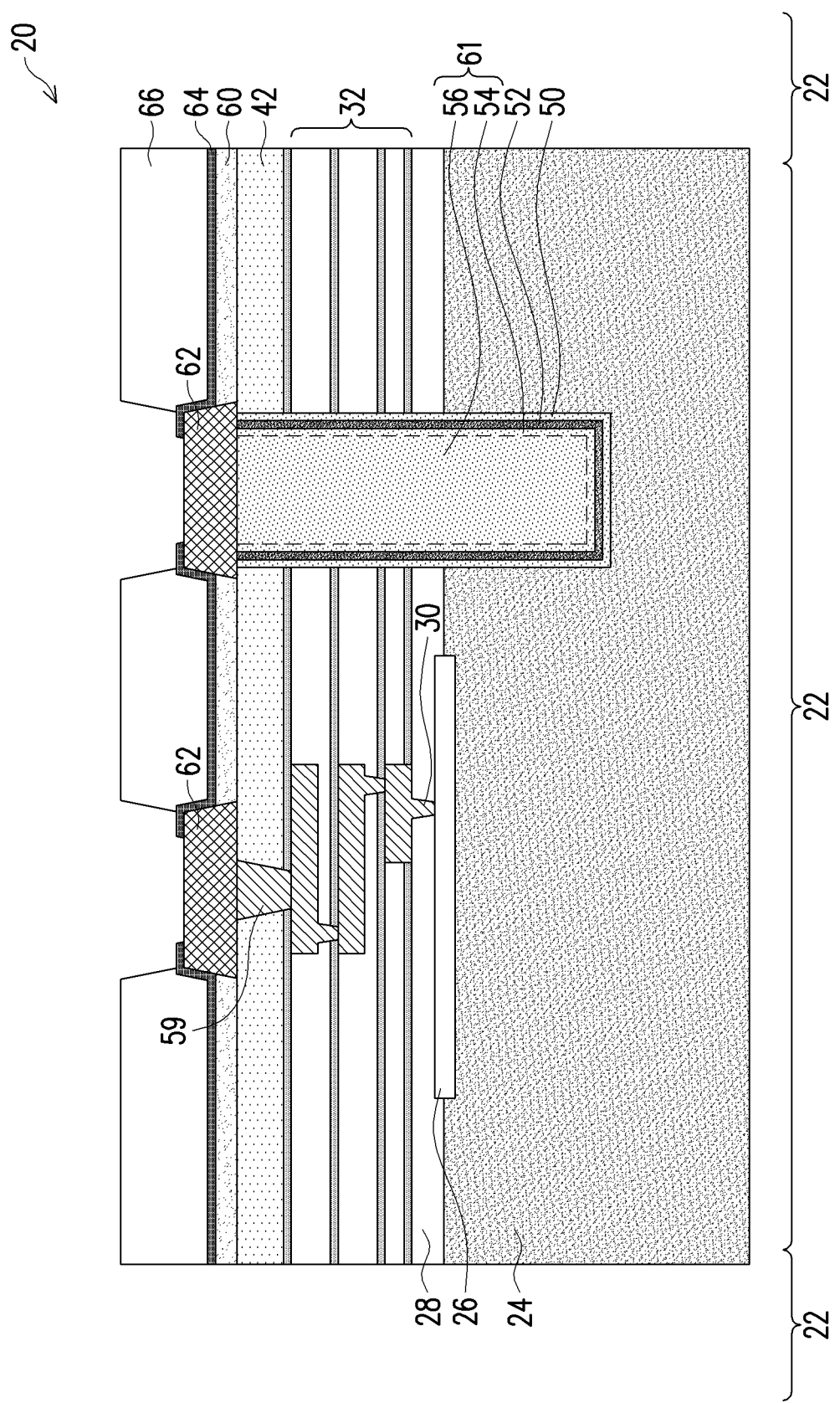

Referring to FIG. 11, isolation layer 60 is etched, and metal pads 62 are formed over passivation layer 42. The respective process is illustrated as process 224 in the process flow 200 as shown in FIG. 25. Metal pads 62 may be aluminum pads or aluminum-copper pads, and other metallic materials may be used. The formation process may include depositing a metal layer, and then patterning the metal layer to leave metal pads 62. Metal pads 62 may also have some portions extending directly over isolation layer 60 in accordance with some embodiments. Passivation layer 64 (sometimes referred to as passivation-2) is then formed. Passivation layer 64 may be a single layer or a composite layer, and may be formed of a non-porous material such as silicon oxide, silicon nitride, USG, silicon oxynitride, or the like.

Next, passivation layer 64 is patterned, so that some portions of passivation layer 64 cover the edge portions of metal pads 62, and some portions of metal pad 62 are exposed through the openings in passivation layer 64. Polymer layer 66 is then formed, for example, by dispensing polymer layer 66 in a flowable form, and then curing polymer layer 66. Polymer layer 66 is then patterned to expose metal pads 62. The respective process is illustrated as process 226 in the process flow 200 as shown in FIG. 25. Polymer layer 66 may be formed of polyimide, polybenzoxazole (PBO), or the like.

Figure 12:
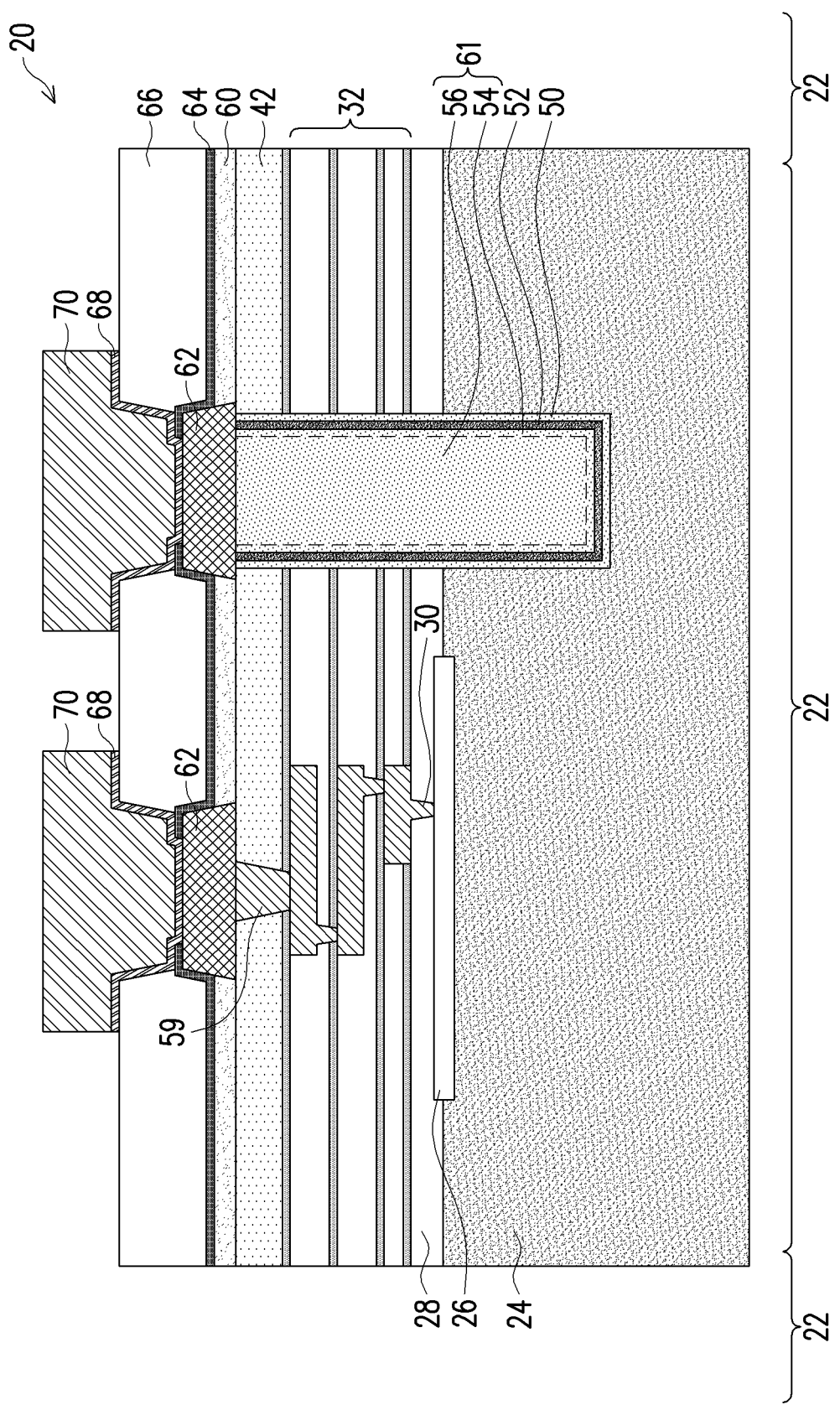

Under-Bump-Metallurgies (UBMs) 68 and conductive regions 70 are then formed to electrically connect to the underlying metal pads 62, as shown in FIG. 12. The respective process is illustrated as process 228 in the process flow 200 as shown in FIG. 25. The formation processes of UBMs 68 and conductive regions 70 may include depositing a blanket metal seed layer extending into the openings in passivation layer 64 and polymer layer 66, forming a patterned plating mask on the metal seed layer, plating conductive regions 70, removing the plating mask, and etching the portions of the blanket metal seed layer previously covered by the plating mask. The remaining portions of the blanket metal seed layer are referred to as UBMs 68. The metal seed layer may include a titanium layer and a copper layer over the titanium layer. Conductive regions 70 may comprise copper, nickel, palladium, aluminum, gold, alloys thereof, and/or multi-layers thereof. Each of conductive regions 70 may include a copper region, which may or may not be capped with a solder region, which may be formed of SnAg or like materials.

Figure 13:
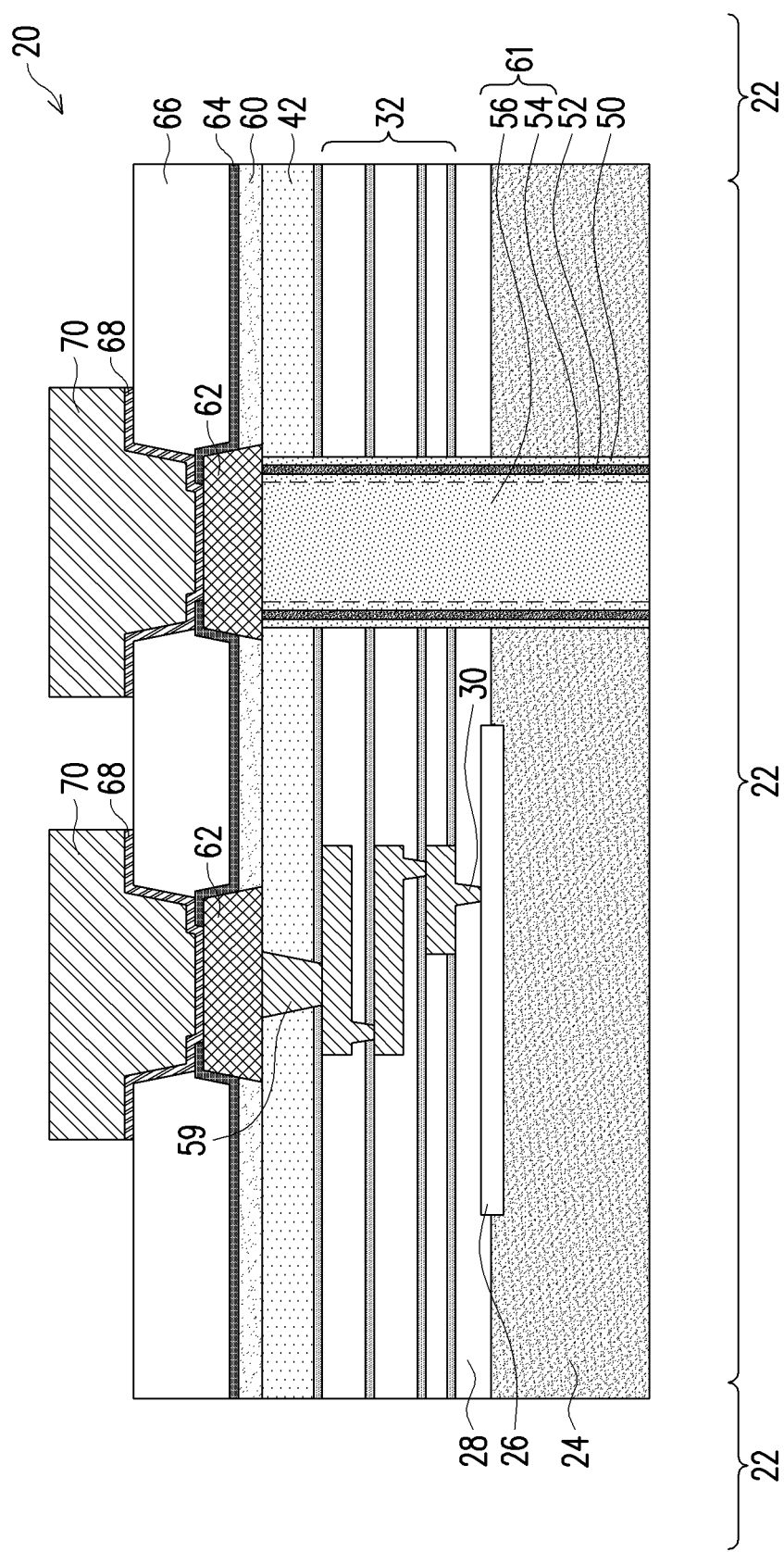
Figure 14:
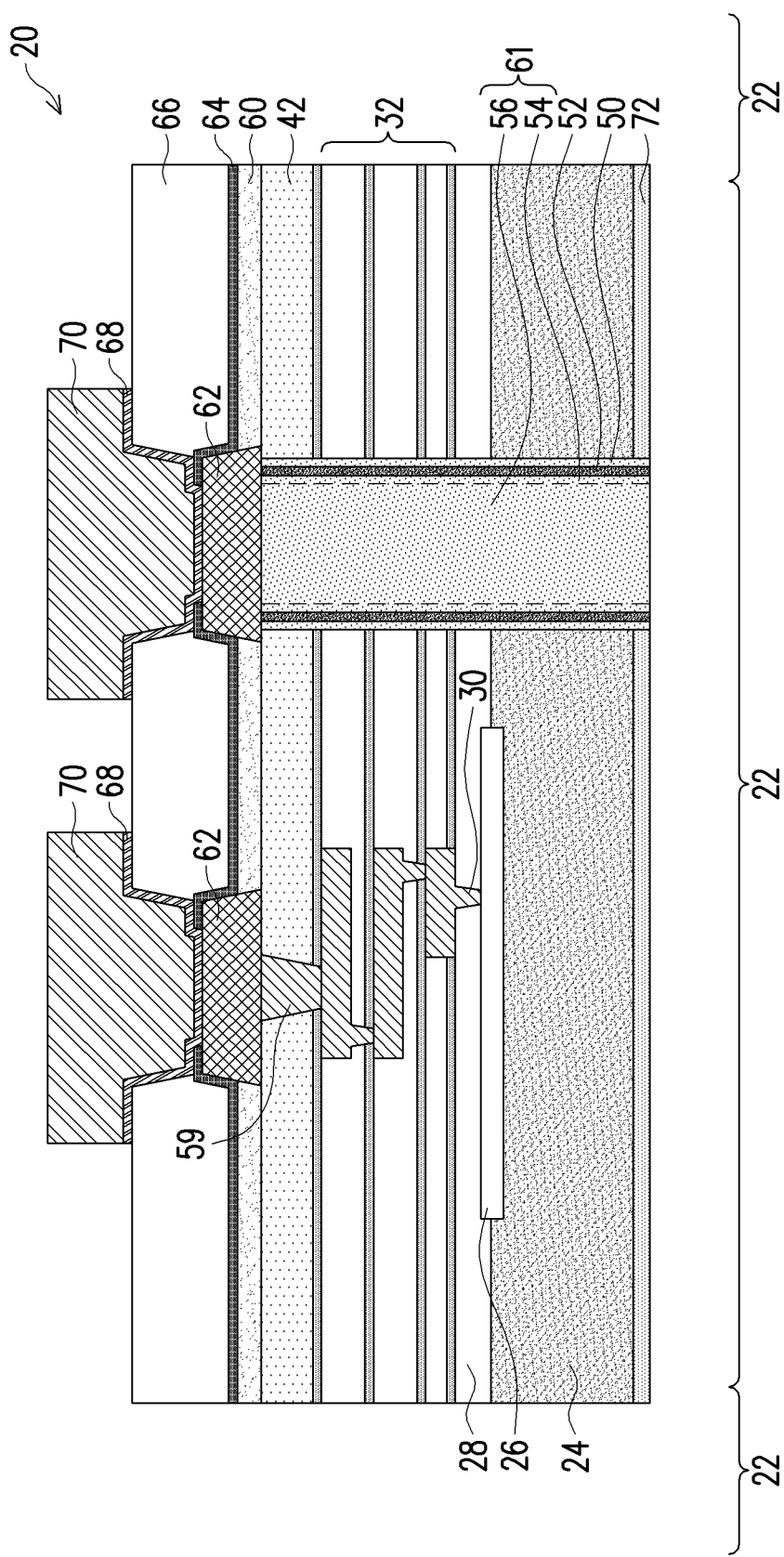
Figure 15:
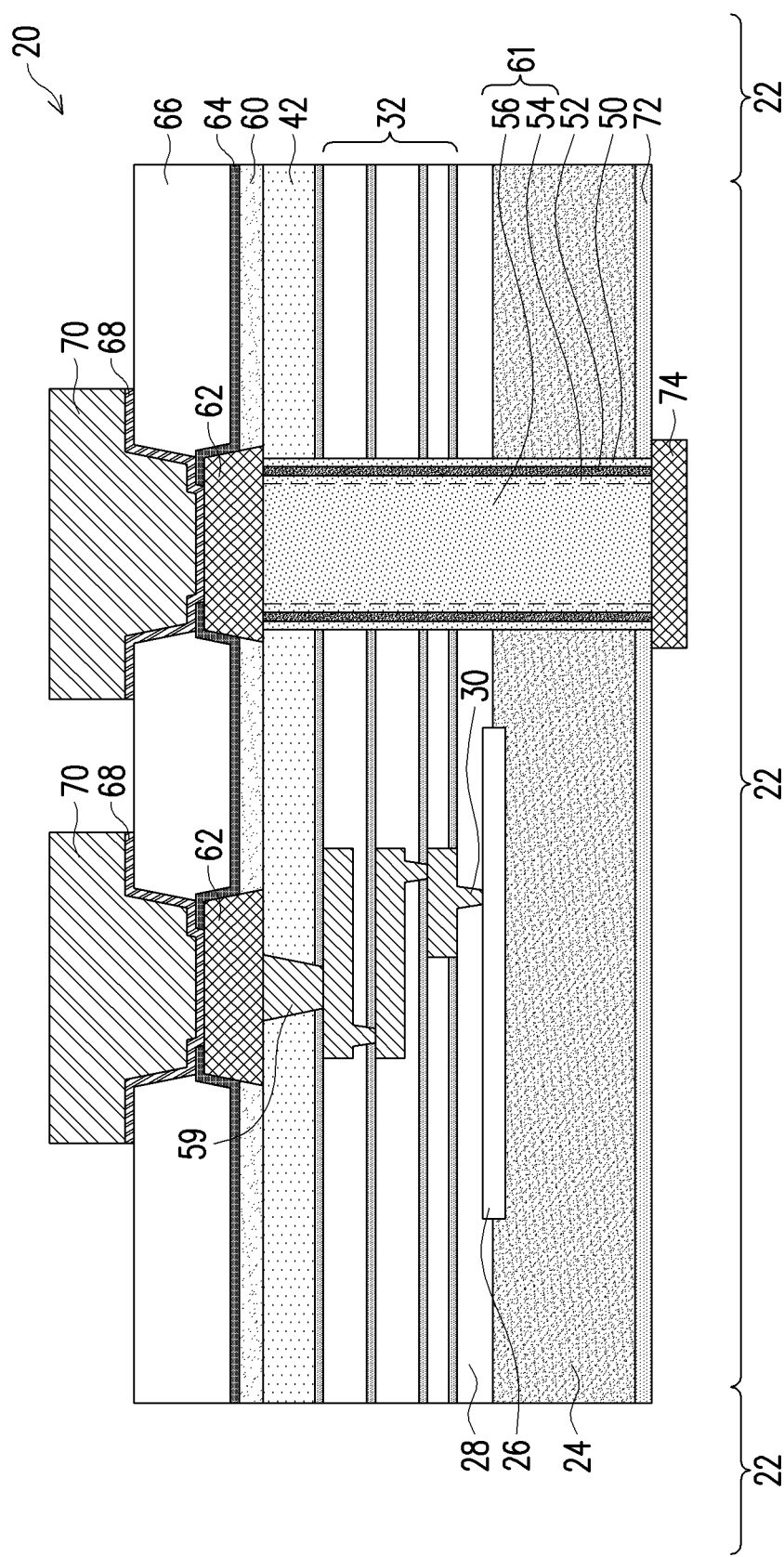

FIGS. 13 through 15 illustrate the process for forming features on the backside of semiconductor substrate 24. The respective process is illustrated as process 230 in the process flow 200 as shown in FIG. 25. Referring to FIG. 13, a backside grinding process is performed to remove a portion of substrate 24, until TSV 61 is revealed. Next, substrate 24 is recessed slightly (for example, through etching), so that TSV 61 protrudes out of the back surface of substrate 24.

Next, as shown in FIG. 14, dielectric layer 72 is deposited, followed by a CMP process or a mechanical grinding process to re-expose TSV 61. TSV 61 thus penetrates through dielectric layer 72. In accordance with some embodiments, dielectric layer 72 is formed of silicon oxide, silicon nitride, or the like. Referring to FIG. 15, RDL 74 is formed, which includes a pad portion contacting TSV 61. RDL 74 may be formed of aluminum, copper, nickel, titanium, or the like in accordance with some embodiments.

Figure 16:
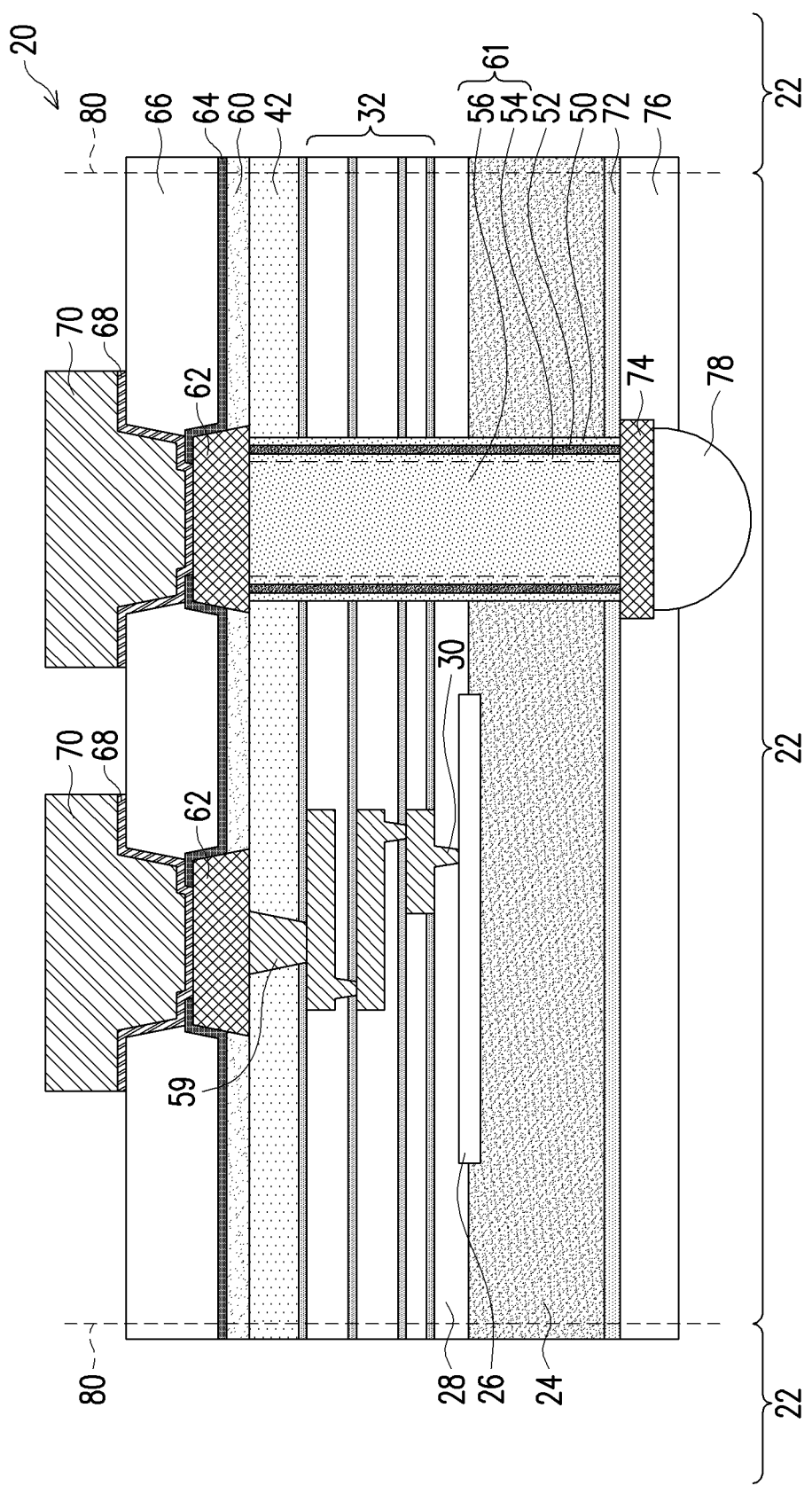

FIG. 16 illustrates the formation of dielectric layer 76 and electrical connector 78. In accordance with some embodiments, electrical connector 78 includes a solder region, which may be formed by plating a solder ball on the pad of RDL 74, and reflowing the solder ball. In accordance with alternative embodiments, electrical connector 78 is formed of non-reflowable (non-solder) metallic materials. For example, electrical connector 78 may be formed as a copper pad or pillar, and may or may not include a nickel capping layer. The formation of electrical connector 78 may also be performed through plating. In accordance with some embodiments, wafer 20 is singulated through a sawing process, for example, by cutting through scribe lines 80.

FIGS. 17 through 22 illustrate the cross-sectional views of intermediate stages in the formation of an interposer in accordance with some embodiments of the present disclosure. Unless specified otherwise, the materials and the formation processes of the components in these embodiments are essentially the same as the like components, which are denoted by like reference numerals in the preceding embodiments shown in FIGS. 1 through 16. The details regarding the formation process and the materials of the components shown in FIGS. 17 through 22 may thus be found in the discussion of the preceding embodiments.

Figure 17:
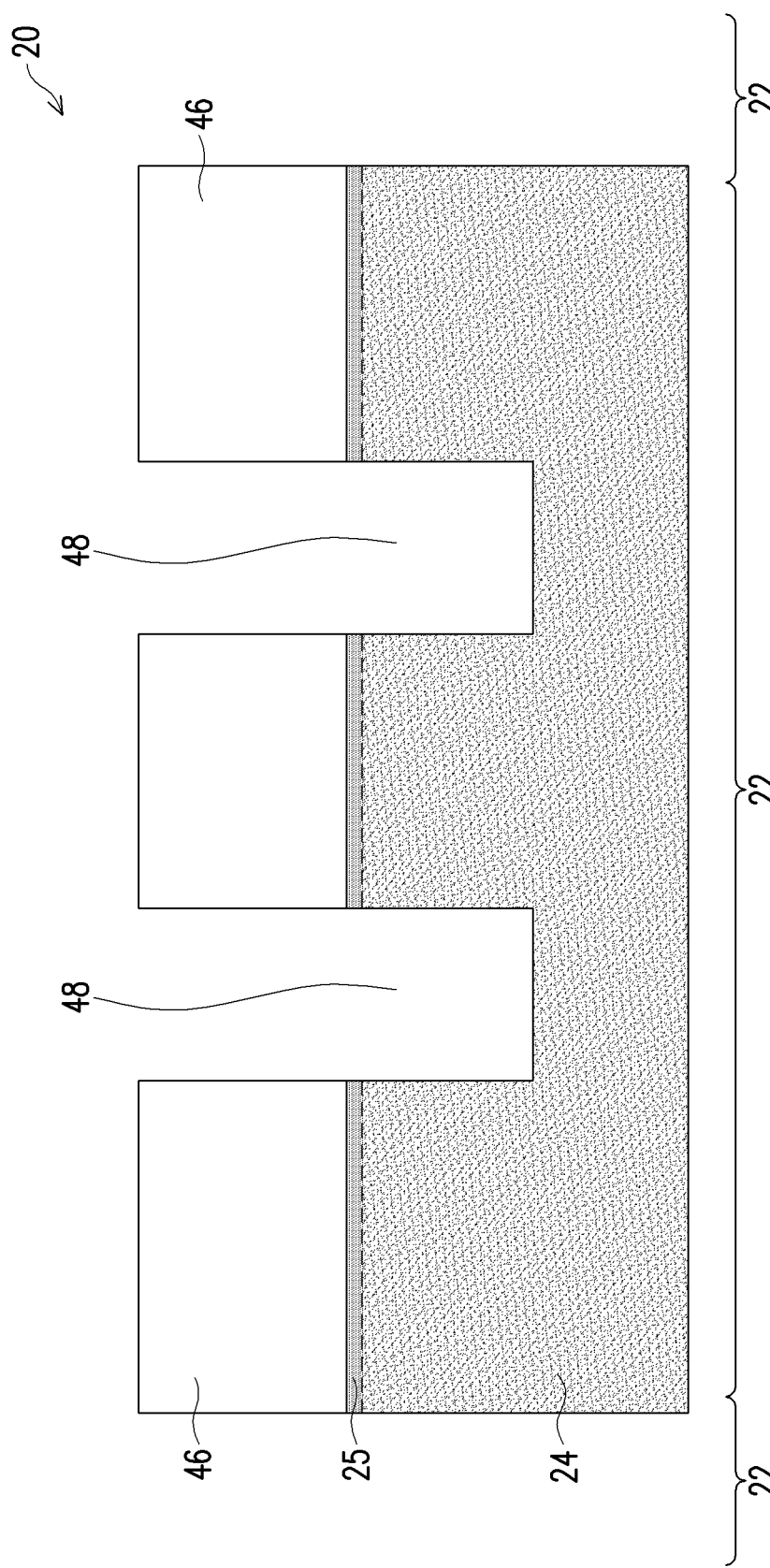
FIGS. 17 through 22 illustrate the cross-sectional views of intermediate stages in the formation of an interposer including through-vias in accordance with some embodiments.

Referring to FIG. 17, wafer 20, which is also substrate 24, is formed. In accordance with some embodiments, substrate 24 is a semiconductor substrate, for example, a silicon substrate. In accordance with alternative embodiments, substrate 24 is a silicon germanium substrate. In accordance with yet alternative embodiments, substrate 24 is a dielectric substrate. Substrate 24 may be a blank substrate, with an entirety of substrate 24 being formed of a homogenous material such as silicon, silicon germanium, carbon-doped silicon, or the like. Furthermore, substrate 24 is free from devices (such as active and passive devices), conductive lines, etc. therein. In accordance with some embodiments, a dielectric layer 25 is formed on the top surface of substrate 24, for example, by performing a thermal oxidation process to convert a top surface layer of substrate 24 into an oxide (silicon oxide, for example). Alternatively, dielectric layer 25 may be formed of silicon nitride, silicon carbide, or the like. In accordance with alternative embodiments, dielectric layer 25 is not formed. Accordingly, dielectric layer 25 is illustrated as being dashed to indicate it may or may not be formed.

Etching mask 46 is formed on substrate 24, and is then patterned. Etching mask 46 may comprise photo resist, and may or may not include a hard mask. Substrate 24 is then etched to form openings 48 in substrate 24, with openings 48 extending to an intermediate level of substrate 24. If dielectric layer 25 is formed, openings 48 further penetrate through dielectric layer 25.

Figure 18:
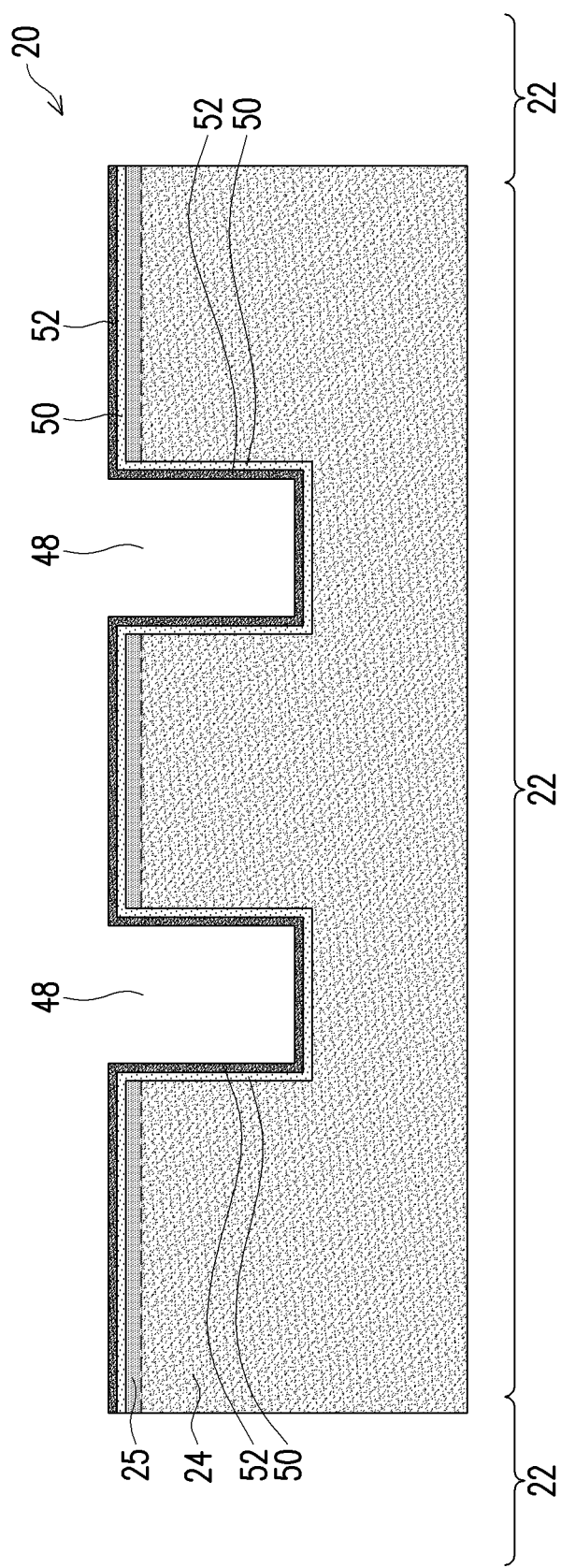
Figure 19:
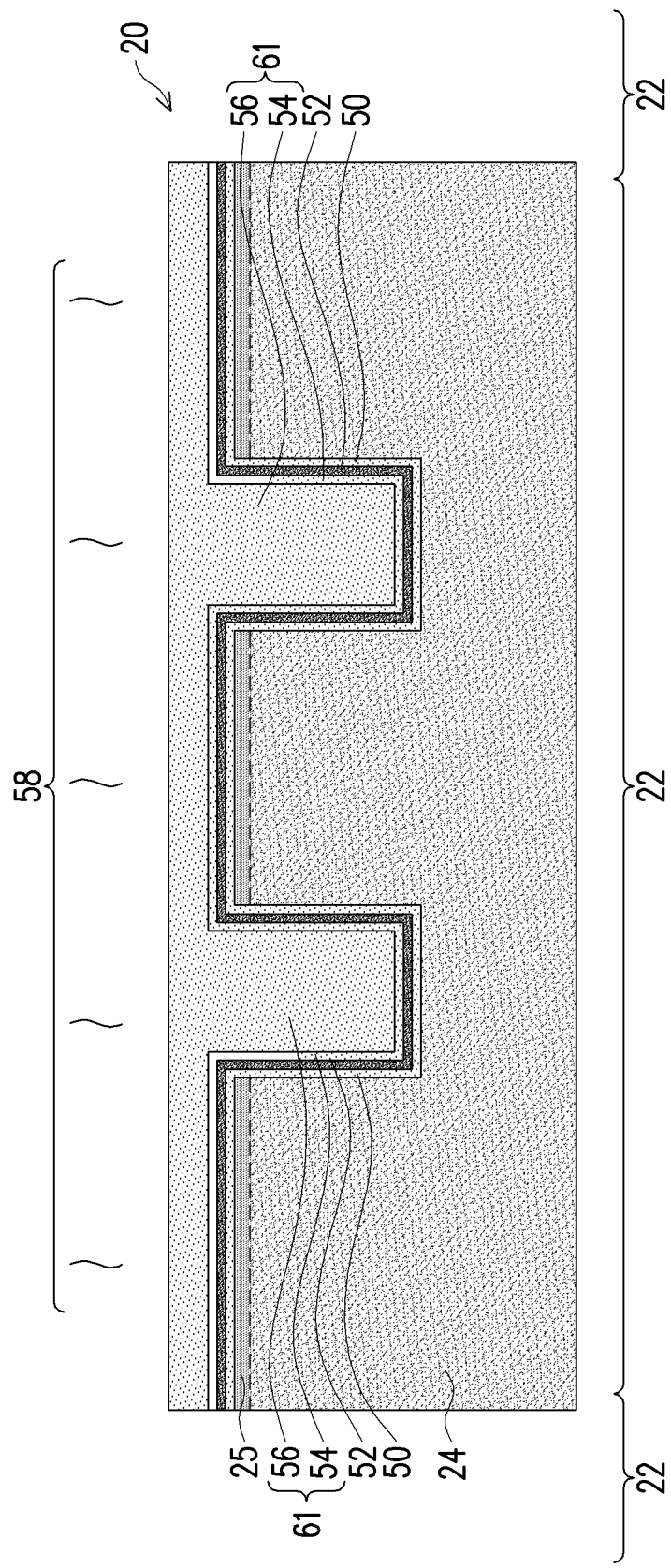

Next, referring to FIG. 18, dielectric liner 50 and dielectric liner 52 are formed through deposition processes. The details of the materials and the deposition processes may be found referring to the discussion provided for preceding embodiments, and are not repeated herein. FIG. 19 illustrates the deposition of metal seed layer 54 and the subsequent deposition of conductive material 56.

Figure 20:
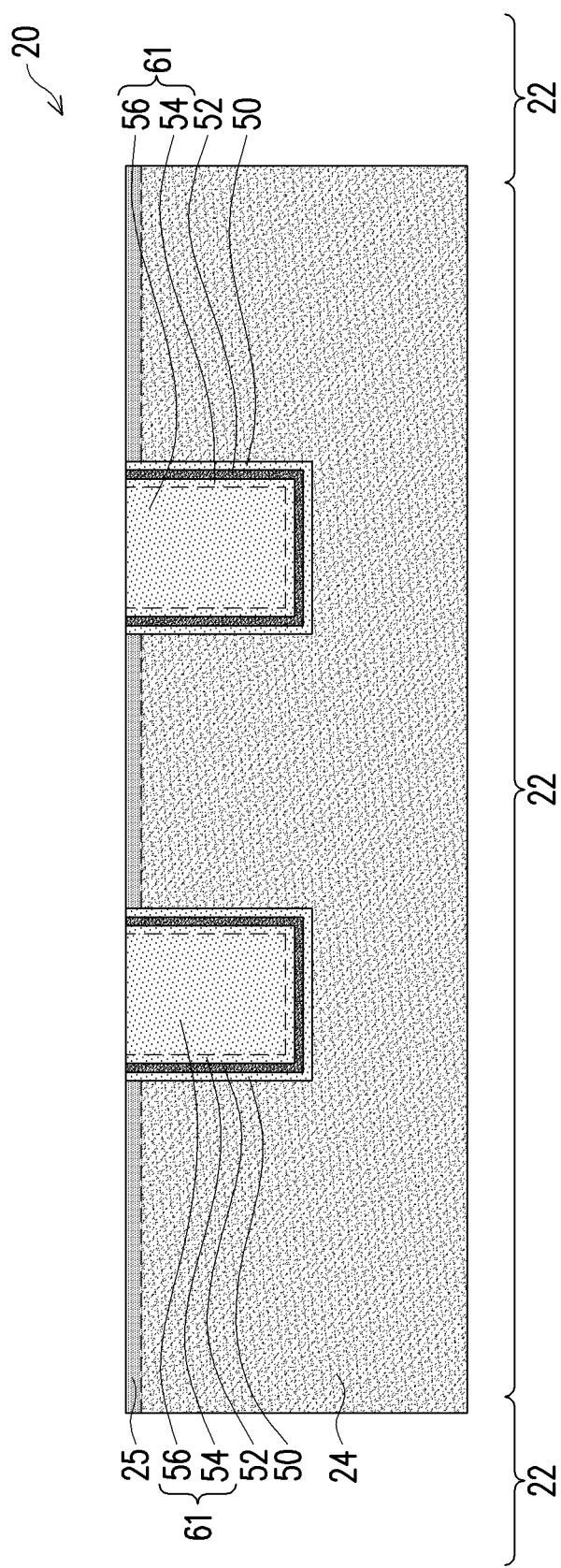

Next, in accordance with some embodiments, annealing process 58 is performed, followed by a planarization process such as a CMP process or a mechanical grinding process. TSVs 61 are thus formed. The resulting structure is shown in FIG. 20. In accordance with alternative embodiments, the deposition process of conductive material 56 is followed by a first planarization process, annealing process 58, and a second planarization process sequentially, which processes are essentially the same as what are shown in FIGS. 7, 8, and 9.

Figure 21:
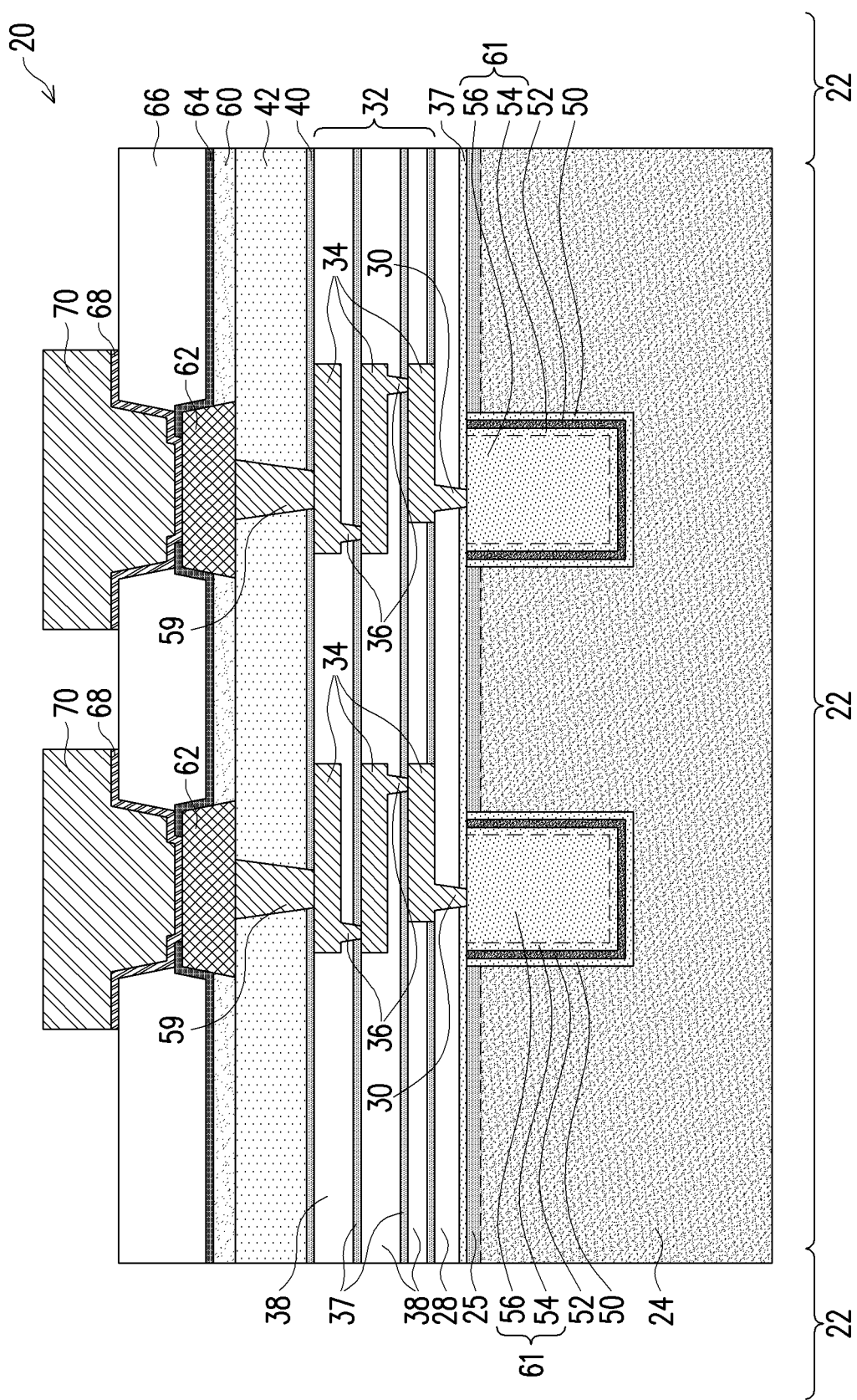

FIG. 21 illustrates the formation of interconnect structure 32, which includes dielectric layers 37 and 38. Dielectric layers 37 may be etch stop layers, and dielectric layers 38 may include an ILD, IMDs, and/or the like. Metal lines 34 and vias 36 are formed in dielectric layers 37 and 38, and are electrically connected to TSVs 61. In subsequent processes, passivation layer 42, passivation layer 64, and polymer layer 66 are formed. Vias 59, metal pads 62, UBMs 68, and conductive regions 70 are also formed. The details of the materials and the formation processes may be found referring to the preceding embodiments.

Figure 22:
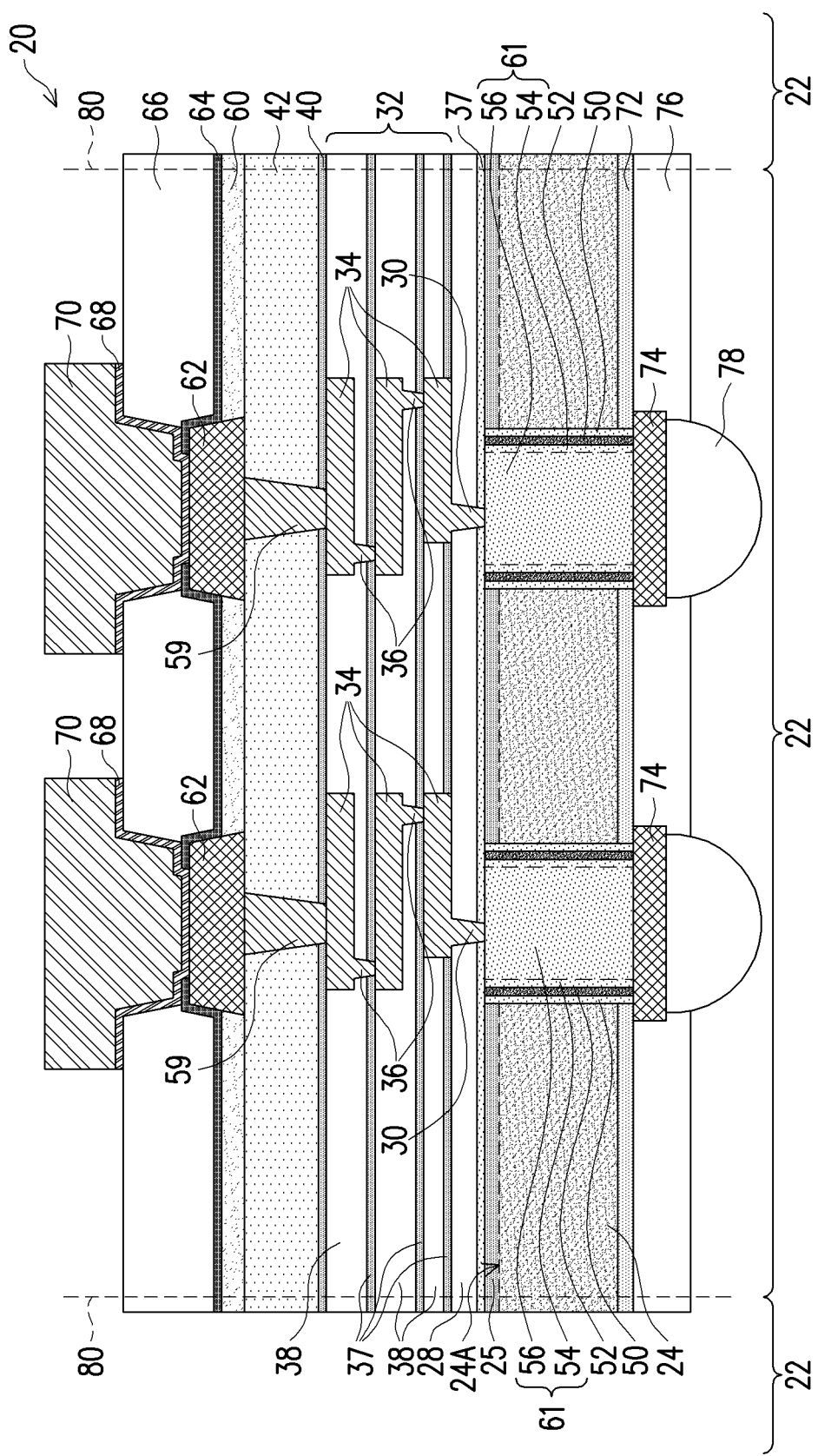

FIG. 22 illustrates the formation of the backside structures on the backside of substrate 24. The formation process includes performing the backside grinding on substrate 24 to reveal TSVs 61, forming dielectric layer 72, forming RDLs 74, forming dielectric layer 76, and forming electrical connectors 78. Wafer 20 may be sawed apart along scribe lines 80 to form interposers 22. Interposer 22 is free from active devices therein, and may be free from passive devices (such as transistors, capacitors, inductors, or the like) therein.

In the example embodiment as shown in FIG. 22, the top surface of TSV 61 are level with (and may be higher than) the top surface of substrate 24. In accordance with alternative embodiments, the top surface of TSV 61 may be at any level between (and including) the top surface 24A of semiconductor substrate 24 and the top surface of passivation layer 42. For example, the top surface of TSV 61 may be level with the top surface of any dielectric layer in interconnect structure 32.

Figure 23:
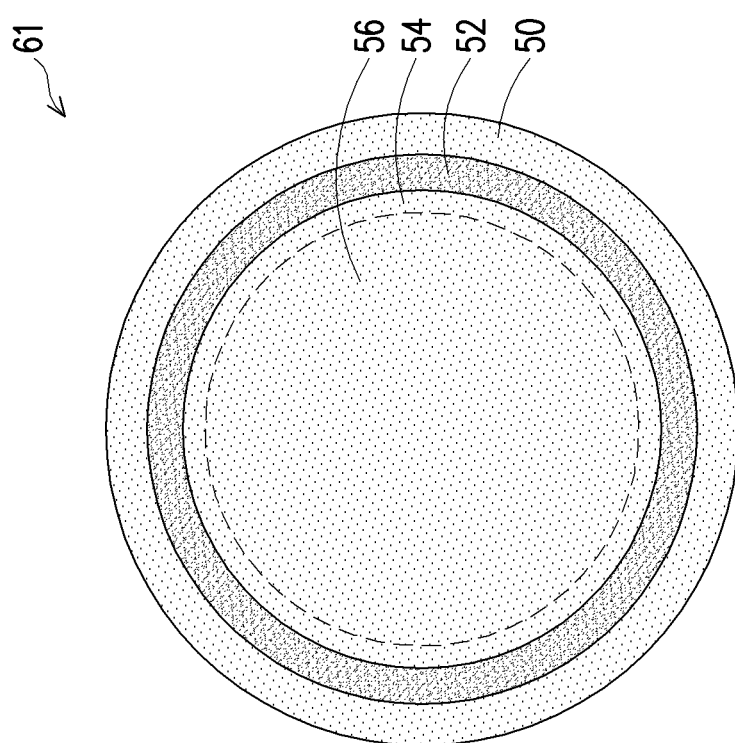
FIG. 23 illustrates a plane view of a multi-liner through-via in accordance with some embodiments.

FIG. 23 illustrates a plane view of TSV 61. In accordance with some embodiments, each of dielectric liners 50 and dielectric liner 52 forms a ring, which may have a circular shape, a polygonal shape (such as a hexagonal shape or an octagonal shape), or the like. Metal seed layer 54 (if including a material different from that of conductive material 56), may be distinguishable.

Figure 24:
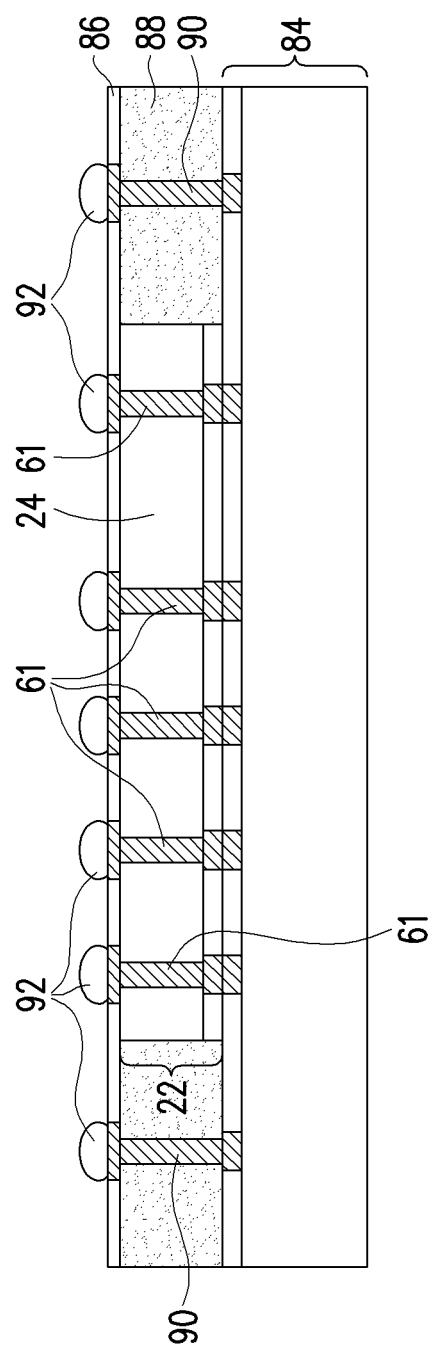
FIG. 24 illustrates a three-dimensional (3D) Integrated Circuit (IC) including a device die in accordance with some embodiments.

FIG. 24 illustrates a package 80, which includes package component 84 bonding with package component 22, which may be a device die 22 (FIG. 16), an interposer 22 (FIG. 22), or the like. Fan-out redistribution structure 86 is formed over package component 22. Redistribution structure 86 may include one or a plurality of layers of redistribution lines. Encapsulant 88, which may be a molding compound or a molding underfill, encapsulates package component 22 therein. Through-vias 90 penetrate through encapsulant 88, and electrically connect package component 84 to redistribution structure 86. Electrical connectors 92, which may be solder regions, are formed to electrically connect to redistribution structure 86.

The embodiments of the present disclosure have some advantageous features. By forming more than one dielectric liner for through-vias, different dielectric liners may serve different functions. A moisture-resistance dielectric liner may effectively isolation the low-k dielectric layers and conductive features from the moisture that may reach these features during and after the formation of through-vias, hence reducing defects. The moisture-resistance dielectric liner may from prevent low-k dielectric layers from being attacked by the byproduct generated in subsequent processes.

In accordance with some embodiments of the present disclosure, a method includes etching a substrate to form an opening; depositing a first dielectric liner extending into the opening; depositing a second dielectric liner over the first dielectric liner, wherein the second dielectric liner extends into the opening; filling a conductive material into the opening; performing a first planarization process to planarize the conductive material, wherein a portion of the conductive material in the opening forms a through-via; performing a backside grinding process on the substrate, until the through-via is revealed from a backside of the substrate; and forming a conductive feature on the backside of the substrate, wherein the conductive feature is electrically connected to the through-via. In an embodiment, the first dielectric liner has better moisture isolation ability than the second dielectric liner. In an embodiment, the depositing the first dielectric liner is performed using plasma enhanced chemical vapor deposition. In an embodiment, the depositing the first dielectric liner comprises depositing silicon nitride, and the depositing the second dielectric liner comprises depositing silicon oxide. In an embodiment, the depositing the first dielectric liner comprises depositing silicon carbide, and the depositing the second dielectric liner comprises depositing silicon oxide. In an embodiment, the method further comprises, before the substrate is etched, depositing a plurality of low-k dielectric layers over the substrate; depositing a passivation layer over the plurality of low-k dielectric layers; and etching the passivation layer and the plurality of low-k dielectric layers to form an additional opening, wherein the opening is connected to the opening in the substrate to form a continuous opening. In an embodiment, the method further comprises annealing the conductive material, wherein the planarizing the conductive material is performed after the annealing. In an embodiment, the method further comprises, before the annealing, performing a second planarization process on the conductive material, wherein a horizontal portion of the first dielectric liner remains after the second planarization process, and wherein the horizontal portion of the first dielectric liner is removed by the first planarization process.

In accordance with some embodiments of the present disclosure, a structure includes a semiconductor substrate; a first conductive feature on a first side of the semiconductor substrate; a second conductive feature on a second side of the semiconductor substrate; a through-via penetrating through the semiconductor substrate, wherein the through-via electrically interconnects the first conductive feature and the second conductive feature; a first dielectric liner encircling the through-via; and a second dielectric liner encircling the first dielectric liner, wherein the first dielectric liner and the second dielectric liner are formed of different materials. In an embodiment, the second dielectric liner has better moisture isolation ability than the first dielectric liner. In an embodiment, the first dielectric liner comprises silicon oxide, and the second dielectric liner comprises silicon nitride. In an embodiment, the first dielectric liner comprises silicon oxide, and the second dielectric liner comprises silicon carbide. In an embodiment, the structure further comprises a plurality of low-k dielectric layers over the semiconductor substrate; and a passivation layer over the plurality of low-k dielectric layers, wherein the through-via further penetrates through the plurality of low-k dielectric layers and the passivation layer. In an embodiment, the structure further comprises a plurality of low-k dielectric layers over the semiconductor substrate, wherein a top surface of the through-via is underlying the plurality of low-k dielectric layers. In an embodiment, the structure further comprises an integrated circuit at a top surface of the semiconductor substrate. In an embodiment, the through-via is in an interposer die, and the interposer die is free from active devices and passive devices therein.

In accordance with some embodiments of the present disclosure, a structure includes a die. The die comprises a semiconductor substrate; a plurality of low-k dielectric layers over the semiconductor substrate; a non-low-k passivation layer over the plurality of low-k dielectric layers; a through-via penetrating through the semiconductor substrate, the plurality of low-k dielectric layers, and the non-low-k passivation layer; a multi-layer dielectric liner encircling the through-via; a first electrical connector over the non-low-k passivation layer and at a top surface of the die; and a second electrical connector underlying the semiconductor substrate and at a bottom surface of the die, wherein the first electrical connector and the second electrical connector are electrically interconnected through the through-via. In an embodiment, the multi-layer dielectric liner comprises an outer layer in contact with the semiconductor substrate and the plurality of low-k dielectric layer, and an inner layer encircled by the outer layer. In an embodiment, the outer layer is in physical contact with the inner layer. In an embodiment, both of the outer layer and the inner layer comprise silicon, and the outer layer has a higher nitrogen atomic percentage than the inner layer, and the inner layer has a higher oxygen atomic percentage than the outer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a substrate to form an opening;
   depositing a first dielectric liner extending into the opening, wherein the depositing the first dielectric liner comprises depositing silicon carbide;
   depositing a second dielectric liner over the first dielectric liner, wherein the second dielectric liner extends into the opening, and wherein the depositing the second dielectric liner comprises depositing silicon oxide;
   filling a conductive material into the opening and over the second dielectric liner;
   performing a first planarization process on the conductive material, wherein the first planarization process is stopped when a horizontal portion of the first dielectric liner still remains and when a top surface of a horizontal portion of the second dielectric liner is exposed;
   performing a second planarization process to planarize the conductive material, wherein the horizontal portion of the second dielectric liner is removed by the second planarization process;
   performing a backside grinding process on the substrate, until the conductive material is revealed from a backside of the substrate, with a remaining portion of the conductive material forming a through-via; and
   forming a conductive feature on the backside of the substrate, wherein the conductive feature is electrically connected to the through-via.

2. The method of claim 1, wherein after the first dielectric liner is deposited, process flow gradually transitions to a deposition process for depositing the second dielectric liner, with a first flow rate of a first precursor for depositing the first dielectric liner gradually reduces, and a second flow rate of a second precursor for depositing the second dielectric liner gradually increases.

3. The method of claim 2, wherein the first precursor comprises a carbon-containing precursor, and the second precursor comprises an oxygen-containing precursor.

4. The method of claim 1, wherein the first dielectric liner has better moisture isolation ability than the second dielectric liner.

5. The method of claim 1, wherein the second dielectric liner is thicker than the first dielectric liner.

6. The method of claim 1, wherein the opening penetrates through a non-low-k passivation layer and a plurality of low-k dielectric layers, and the opening further extends into the substrate.

7. The method of claim 1, wherein the depositing the first dielectric liner is performed using plasma enhanced chemical vapor deposition.

8. The method of claim 1, wherein the horizontal portion of the first dielectric liner is also removed by the second planarization process.

9. The method of claim 1 further comprising, after the first planarization process, performing an annealing process, wherein the annealing process results in a portion of the conductive material to protrude over the top surface of the horizontal portion of the second dielectric liner, and wherein the portion of the conductive material is removed by the second planarization process.

10. The method of claim 1, wherein the horizontal portion of the second dielectric liner contacts the horizontal portion of the first dielectric liner to form a horizontal interface.

11. The method of claim 1, wherein the substrate comprises a semiconductor material, and the through-via fully penetrates through the substrate.

12. A method comprising:
   performing an etching process to form an opening extending into a semiconductor substrate;
   forming a plurality of concentric features to fill the opening, wherein the forming the plurality of concentric features comprise:
      depositing a first dielectric liner, wherein the first dielectric liner comprises silicon carbide;
      depositing a second dielectric liner, wherein the second dielectric liner comprises silicon oxide;
      depositing a conductive material on the second dielectric liner and in the opening;
      performing a first planarization process on the conductive material, wherein the first planarization process is performed using a first horizontal portion of the second dielectric liner as a stop layer, wherein a remaining portion of the conductive material forms a through-via encircled by the second dielectric liner;
      after the first planarization process, performing a second planarization process on the through-via, wherein a second horizontal portion of the first dielectric liner is removed by the second planarization process;
   forming a first conductive feature on a first side of the semiconductor substrate; and
   forming a second conductive feature on a second side of the semiconductor substrate, wherein the first conductive feature and the second conductive feature are electrically connected by the through-via.

13. The method of claim 12 further comprising, after the first planarization process, performing an annealing process, wherein the second planarization process is performed after the annealing process.

14. The method of claim 13, wherein the annealing process results in a portion of the conductive material to protrude over the first horizontal portion of the second dielectric liner, and wherein the portion of the conductive material is removed by the second planarization process.

15. The method of claim 12, wherein the first horizontal portion of the second dielectric liner comprises a bottom surface contacting the first dielectric liner to form a horizontal interface.

16. The method of claim 12, wherein the through-via fully penetrates through the semiconductor substrate.

17. A method comprising:
   depositing a plurality of low-k dielectric layers over a semiconductor substrate;
   depositing a non-low-k passivation layer over the plurality of low-k dielectric layers;
   etching the non-low-k passivation layer, the plurality of low-k dielectric layers, and the semiconductor substrate to form an opening;
   depositing a multi-layer dielectric liner extending into the semiconductor substrate, wherein the depositing the multi-layer dielectric liner comprises:
      depositing a first dielectric liner using a first precursor that comprises nitrogen, wherein the first dielectric liner comprises a first dielectric material;
      depositing a second dielectric liner over the first dielectric liner, wherein the second dielectric liner comprises silicon oxynitride;
      depositing a third dielectric liner comprising a second dielectric material different from the first dielectric material on the second dielectric liner, wherein the third dielectric liner is deposited using a second precursor that comprises oxygen, and wherein during the depositing the second dielectric liner, a first flow rate of the first precursor is reduced gradually, and a second flow rate of the second precursor is increased gradually;

depositing a conductive material filling the opening; and polishing the conductive material to form a through-via.

18. The method of claim 17, wherein the depositing the conductive material comprises:

depositing a conductive barrier; and depositing a metallic material on the conductive barrier.

19. The method of claim 17, wherein the through-via fully penetrates through the semiconductor substrate.

20. The method of claim 17 further comprising forming a first conductive feature and a second conductive feature, wherein the first conductive feature and the second conductive feature are joined to opposing ends of the through-via.

* * * * *